(12) United States Patent
Chen

(10) Patent No.: US 11,791,010 B2
(45) Date of Patent: *Oct. 17, 2023

(54) METHOD AND DEVICE FOR FAIL BIT REPAIRING

(71) Applicant: CHANGXIN MEMORY TECHNOLOGIES, INC., Hefei (CN)

(72) Inventor: Yui-Lang Chen, Hefei (CN)

(73) Assignee: CHANGXIN MEMORY TECHNOLOGIES, INC., Anhui (CN)

(*) Notice: Subject to any disclaimer, the term of this patent is extended or adjusted under 35 U.S.C. 154(b) by 14 days.

This patent is subject to a terminal disclaimer.

(21) Appl. No.: 17/464,886

(22) Filed: Sep. 2, 2021

(65) Prior Publication Data

US 2022/0059183 A1 Feb. 24, 2022

Related U.S. Application Data

(63) Continuation of application No. PCT/CN2021/099149, filed on Jun. 9, 2021.

(30) Foreign Application Priority Data

Aug. 18, 2020 (CN) .......................... 202010832396.1

(51) Int. Cl.
  *G11C 29/00* (2006.01)
  *G11C 29/44* (2006.01)
  *G11C 29/12* (2006.01)

(52) U.S. Cl.
  CPC ...... *G11C 29/4401* (2013.01); *G11C 29/1201* (2013.01); *G11C 29/789* (2013.01);
  (Continued)

(58) Field of Classification Search
  CPC .................................................. G11C 29/4401
  See application file for complete search history.

(56) References Cited

U.S. PATENT DOCUMENTS

| 6,067,259 A | 5/2000 | Handa |
| 6,535,993 B1 | 3/2003 | Hamada |

(Continued)

FOREIGN PATENT DOCUMENTS

| CN | 1195814 A | 10/1998 |
| CN | 1366308 A | 8/2002 |

(Continued)

OTHER PUBLICATIONS

International Search Report in the international application No. PCT/CN2021/099159, dated Sep. 8, 2021, 2 pgs.

(Continued)

*Primary Examiner* — Min Huang
(74) *Attorney, Agent, or Firm* — Cooper Legal Group, LLC

(57) ABSTRACT

A method and device for Fail Bit (FB) repairing. The method includes: a bank to be repaired of a chip to be repaired is determined; first repair processing is performed on first FBs in each target repair bank using a redundant circuit; second FBs are determined, and second repair processing is performed on the second FBs through a state judgment repair operation; for each target repair bank, unrepaired FBs in the target repair bank is determined, and candidate repair combinations and candidate repair costs of the unrepaired FBs are determined using an optimal combined detection manner; and a target repair cost is determined according to the candidate repair costs, and a target repair solution corresponding to the target repair cost is determined to perform repair processing on the unrepaired FBs according to the target repair solution.

20 Claims, 18 Drawing Sheets

(52) U.S. Cl.
CPC ............... *G11C 2029/1202* (2013.01); *G11C 2029/1204* (2013.01)

(56) References Cited

U.S. PATENT DOCUMENTS

| | | | |
|---|---|---|---|
| 6,741,509 B2 | 5/2004 | Kato | |
| 6,876,588 B2 | 4/2005 | Kato | |
| 7,079,432 B2 | 7/2006 | Kato | |
| 7,127,647 B1 | 10/2006 | Zorian | |
| 7,224,596 B2 | 5/2007 | Jeong | |
| 10,446,253 B2* | 10/2019 | Choi | G11C 29/72 |
| 2001/0009521 A1 | 7/2001 | Hidaka | |
| 2001/0026486 A1 | 10/2001 | Ogawa | |
| 2002/0001896 A1 | 1/2002 | Yoon | |
| 2002/0114198 A1 | 8/2002 | Kato | |
| 2002/0191454 A1 | 12/2002 | Beer | |
| 2003/0164510 A1 | 9/2003 | Dono | |
| 2003/0191991 A1 | 10/2003 | Hsu | |
| 2004/0062134 A1 | 4/2004 | Kato | |
| 2004/0210803 A1 | 10/2004 | Cheng | |
| 2005/0039073 A1 | 2/2005 | Hartmann | |
| 2005/0122802 A1 | 6/2005 | Kato | |
| 2006/0090058 A1 | 4/2006 | Chng | |
| 2006/0098503 A1 | 5/2006 | Jeong | |
| 2007/0247937 A1 | 10/2007 | Moriyama | |
| 2009/0119537 A1 | 5/2009 | Lee | |
| 2009/0316469 A1 | 12/2009 | Rodriguez | |
| 2009/0319839 A1 | 12/2009 | Surulivel | |
| 2010/0157656 A1 | 6/2010 | Tsuchida | |
| 2010/0169705 A1* | 7/2010 | Fujii | G11C 29/72 714/719 |
| 2010/0290299 A1 | 11/2010 | Matsumoto | |
| 2010/0322024 A1 | 12/2010 | Yagishita | |
| 2011/0002169 A1 | 1/2011 | Li | |
| 2011/0090751 A1 | 4/2011 | Manna | |
| 2011/0199845 A1 | 8/2011 | Yang | |
| 2012/0173932 A1 | 7/2012 | Li | |
| 2012/0206973 A1 | 8/2012 | He | |
| 2012/0257467 A1 | 10/2012 | Kosugi | |
| 2012/0275249 A1 | 11/2012 | Yang | |
| 2012/0297245 A1 | 11/2012 | Li et al. | |
| 2013/0173970 A1 | 7/2013 | Kleveland | |
| 2014/0146613 A1 | 5/2014 | Yang et al. | |
| 2014/0219023 A1 | 8/2014 | Li et al. | |
| 2015/0066417 A1 | 3/2015 | Kimura | |
| 2015/0178614 A1 | 6/2015 | Lin | |
| 2015/0248322 A1 | 9/2015 | Hara et al. | |
| 2016/0005452 A1 | 1/2016 | Bae | |
| 2016/0307645 A1 | 10/2016 | Kim | |
| 2016/0351276 A1 | 12/2016 | Shim | |
| 2017/0110206 A1 | 4/2017 | Ryu et al. | |
| 2017/0133108 A1 | 5/2017 | Lee | |
| 2018/0182467 A1 | 6/2018 | Kang et al. | |
| 2019/0164621 A1 | 5/2019 | Kim | |
| 2019/0237154 A1 | 8/2019 | Choi | |
| 2019/0287641 A1 | 9/2019 | Ko | |
| 2019/0348100 A1 | 11/2019 | Smith et al. | |
| 2019/0348102 A1 | 11/2019 | Smith et al. | |
| 2020/0152285 A1 | 5/2020 | Nakaoka | |
| 2020/0243159 A1 | 7/2020 | Kang et al. | |
| 2022/0058079 A1* | 2/2022 | Chen | G11C 29/72 |
| 2022/0058080 A1* | 2/2022 | Chen | G06F 11/0793 |
| 2022/0059182 A1* | 2/2022 | Chen | G11C 29/76 |
| 2022/0270668 A1 | 8/2022 | Li et al. | |
| 2022/0310187 A1 | 9/2022 | Chen | |
| 2022/0317908 A1 | 10/2022 | Chen | |

FOREIGN PATENT DOCUMENTS

| | | | |
|---|---|---|---|
| CN | 1404140 | A | 3/2003 |
| CN | 1409323 | A | 4/2003 |
| CN | 1467746 | A | 1/2004 |
| CN | 101329918 | A | 12/2008 |
| CN | 101331554 | A | 12/2008 |
| CN | 101630337 | A | 1/2010 |
| CN | 101765889 | A | 6/2010 |
| CN | 102157203 | A | 8/2011 |
| CN | 101765889 | B | 12/2013 |
| CN | 103473160 | A | 12/2013 |
| CN | 103688247 | A | 3/2014 |
| CN | 103871447 | A | 6/2014 |
| CN | 105787817 | A | 7/2016 |
| CN | 105989899 | A | 10/2016 |
| CN | 109753374 | A | 5/2019 |
| CN | 110010187 | A | 7/2019 |
| CN | 110364214 | A | 10/2019 |
| CN | 110556157 | A | 12/2019 |
| CN | 110797071 | A | 2/2020 |
| CN | 110797072 | A | 2/2020 |
| CN | 110879931 | A | 3/2020 |
| CN | 110968985 | A | 4/2020 |
| CN | 111312321 | A | 6/2020 |
| CN | 112216621 | A | 1/2021 |
| CN | 112885398 | A | 6/2021 |
| CN | 112908402 | A | 6/2021 |
| CN | 112908403 | A | 6/2021 |
| EP | 1217524 | A2 | 6/2002 |
| JP | 2000048596 | A | 2/2000 |
| JP | 2008084409 | A | 4/2008 |
| KR | 100795520 | B1 | 1/2008 |
| KR | 20160016422 | A | 2/2016 |
| KR | 20190093358 | A | 8/2019 |
| TW | 376558 | B | 12/1999 |
| TW | 470964 | B | 1/2002 |
| TW | 201110132 | A | 3/2011 |
| TW | 201642273 | A | 12/2016 |

OTHER PUBLICATIONS

International Search Report in the international application No. PCT/CN2021/099149, dated Sep. 7, 2021, 2 pgs.
International Search Report in the international application No. PCT/CN2021/099146, dated Sep. 7, 2021, 2 pgs.
International Search Report in the international application No. PCT/CN2021/099173, dated Aug. 26, 2021, 2 pgs.
Supplementary European Search Report in the European application No. 21773439.1, dated Jun. 27, 2022, 8 pgs.
English translation of the Written Opinion of the International Search Authority in the international application No. PCT/CN2021/099159, dated Sep. 8, 2021, 4 pgs.
English translation of the Written Opinion of the International Search Authority in the international application No. PCT/CN2021/099149, dated Sep. 7, 2021, 4 pgs.
First Office Action of the European application No. 21773439.1, dated Feb. 24, 2023, 6 pgs.
First Office Action of the U.S. Appl. No. 17/462,042, dated Mar. 2, 2023, 63 pgs.
English translation of the Written Opinion of the International Search Authority in the international application No. PCT/CN2021/099146, dated Sep. 7, 2021, 4 pgs.
English translation of the Written Opinion of the International Search Authority in the international application No. PCT/CN2021/099173, dated Aug. 26, 2021, 3 pgs.
First Office Action of the U.S. Appl. No. 17/445,300, dated Mar. 2, 2023, 59 pgs.
International Search Report in the international application No. PCT/CN2021/109442, dated Jan. 4, 2022, 3 pgs.
Notice of Allowance of the Chinese application No. 202110352509.2, dated Apr. 15, 2022, 7 pgs.
International Search Report in the international application No. PCT/CN2021/109515, dated Dec. 30, 2021, 2 pgs.
Notice of Allowance of the Chinese application No. 202110352499.2, dated Apr. 15, 2022, 8 pgs.
First Office Action of the U.S. Appl. No. 17/515,776, dated Mar. 3, 2023, 21 pgs.
International Search Report in the international application No. PCT/CN2021/109464, dated Dec. 30, 2021, 2 pgs.
Notice of Allowance of the Chinese application No. 202110327478.5, dated Apr. 25, 2022, 7 pgs.

(56) References Cited

OTHER PUBLICATIONS

"Enhancement of Fault Collection for Embedded RAM Redundancy Analysis Considering Intersection and Orphan Faults", Mar. 2018, Stefan Kristofik and Peter Malfik, Integration, The VLSI Journal North-Holland Publishing Company, Amsterdam, NL, vol. 62, pp. 190-204.
"On the Repair of Redundant RAM's", Mar. 1987, Chin-Long Wey and Fabrizion Lombardi, IEEE Transactions on Computer-Aided Design of Integrated Circuits and Systems, IEEE, USA, vol. CAD-06, No. 2, pp. 222-231.
Notice of Allowance of the U.S. Appl. No. 17/568,948, dated Aug. 30, 2023, 60 pages.
Non-Final Office Action of the U.S. Appl. No. 17/648,665, dated Aug. 28, 2023, 67 pages.
Non-Final Office Action of the U.S. Appl. No. 17/446,978, dated Aug. 21, 2023, 51 pages.
Notice of Allowance of the Chinese application No. 202010833678.3, dated Jun. 12, 2023, 4 pages with English abstract.
Notice of Allowance of the U.S. Appl. No. 17/445,300, dated Aug. 17, 2023, 65 pages.
Notice of Allowance of the U.S. Appl. No. 17/462,042, dated Jun. 20, 2023, 63 pages.
Notice of Allowance of the Chinese application No. 202010832380.0, dated Jun. 12, 2023, 5 pages with English abstract.
Notice of Allowance of the Chinese application No. 202010832396.1, dated Jun. 12, 2023, 5 pages with English abstract.

\* cited by examiner

METHOD AND DEVICE FOR FAIL BIT REPAIRING

CROSS-REFERENCE TO RELATED APPLICATIONS

This is a continuation of International Application No. PCT/CN2021/099149, filed on Jun. 9, 2021 and entitled "METHOD AND DEVICE FOR FAIL BIT REPAIRING ", which claims priority to Chinese patent application No. 202010832396.1, filed on Aug. 18, 2020 and entitled "METHOD AND DEVICE FOR FAIL BIT REPAIRING". The contents of International Application No. PCT/CN2021/099149 and Chinese patent application No. 202010832396.1 are hereby incorporated by reference in their entireties.

TECHNICAL FIELD

The disclosure relates to the technical field of integrated circuits, and particularly to a method and device for Fail Bit (FB) repairing.

BACKGROUND

With the rapid development of computer technologies, integrated circuit chip has played an increasingly important role in people's production and life. However, failure problems are inevitable during development, production, and use of chips, and redundant circuits may usually be adopted for repair processing of FBs in the chips.

If presently available redundant circuits include more than one allocation that may really repair all FBs, it is considered that there is really a solution to redundant-circuit-based BF repair. When there is really a solution, at least one allocation solution may definitely be found. This is an optimal allocation method. At present, the redundant circuit allocation method is non-optimal.

It is to be noted that the information disclosed in BACKGROUND is only used to strengthen the understanding to the background of the disclosure and thus may include information that does not constitute the prior art known to those skilled in the art.

SUMMARY

According to an aspect of the disclosure, a method for FB repairing is provided, which may include that: determining a bank to be repaired of a chip to be repaired, herein the bank to be repaired includes a plurality of target repair banks; performing first repair processing on first FBs in each target repair bank using a redundant circuit; after performing the first repair processing, determining second FBs, and performing second repair processing on the second FBs through a state judgment repair operation, herein the second FBs are FBs that meet a specific condition; for each target repair bank, determining unrepaired FBs in the target repair bank, and determining, using an optimal combined detection manner, candidate repair combinations for the unrepaired FBs, candidate repair costs, each corresponding to a respective one of the candidate repair combinations; and determining a target repair cost according to the candidate repair costs, and determining a target repair solution corresponding to the target repair cost to perform repair processing on the unrepaired FBs according to the target repair solution.

The disclosure also discloses a device for FB repairing, which may include: a bank determination module, configured to determine a bank to be repaired of a chip to be repaired, herein the bank to be repaired includes a plurality of target repair banks; a first repair processing module, configured to perform first repair processing on first FBs in each target repair bank using a redundant circuit; a second repair processing module, configured to, after performing the first repair processing, determine second FBs, and perform second repair processing on the second FBs through a state judgment repair operation, herein the second FBs are FBs that meet a specific condition; a candidate repair cost determination module, configured to, for each target repair bank, determine unrepaired FBs in the target repair bank, and determine, using an optimal combined detection manner, candidate repair combinations for the unrepaired FBs, candidate repair costs, each corresponding to a respective one of the candidate repair combinations; and a third repair processing module, configured to determine a target repair cost according to the candidate repair costs, and determine a target repair solution corresponding to the target repair cost to perform repair processing on the unrepaired FBs according to the target repair solution.

It is to be understood that the above general description and the following detailed description are only exemplary and explanatory and not intended to limit the disclosure.

BRIEF DESCRIPTION OF THE DRAWINGS

The drawings, which are incorporated in and constitute a part of this specification, illustrate embodiments consistent with the disclosure and, together with the specification, serve to explain the principle of the disclosure. It is apparent that the drawings in the following descriptions are only some embodiments of the disclosure, and those skilled in the art may also obtain other drawings according to these drawings without creative efforts. In the drawings.

DETAILED DESCRIPTION

An objective of the disclosure is to provide a method and device for FB repairing, to solve the problems of relatively high operation cost caused by a relatively large count of candidate combinations of FBs and relatively high operation cost caused by ineffective calculation incapable of timely determining that there is no allocation solution for a chip to be repaired.

In order to make the objectives, features, and advantages of the disclosure clearer and easier to understand, the disclosure will further be described below in detail in combination with the drawings and specific implementations.

Failure problems are inevitable during development, production, and use of chips, and redundant circuits may usually be adopted for repair processing of FBs in the chips. However, the present redundant circuit allocation method is non-optimal. For example, a Dynamic Random Access Memory (DRAM) may be divided into a cell region and a periphery region. The cell region includes many storage cells, so the storage cells may be divided into banks.

Redundant circuits may be divided into two types of orthogonal straight lines, i.e., Redundant Bit-Lines (RBLs) and Redundant Word-Lines (RWLs). When redundant circuits repairs FBs, the repair range is half of a bank (half-bank), and the redundant circuits are limited in quantity. A plurality of banks are divided in a chip, and if not all FBs in a half-bank of only one repair range repaired successfully, the chip is scrapped. At present, a common allocation method includes preferentially allocating RBLs for repair, and allocating RWLs for repair when there are no enough RBLs. When the existing allocation method is adopted, if there is a really solution, an allocation result may usually not repair all FBs successfully, resulting in scrapping of the whole chip and greatly reducing the yield.

In a process of performing repair processing on a chip to be repaired, since there are a plurality of repair combinations for the chip to be repaired, if all the repair combinations for the chip to be repaired are determined directly by traversing, and repair costs corresponding to each repair solution are calculated one by one, the calculation burden is quite high, and the calculation speed is relatively low. Moreover, if the direct calculation manner is adopted, a chip to be repaired for which there is a repair solution may be determined as a fail chip because of the high calculation burden, etc., or a lot of ineffective operations may be performed because a chip to be repaired for which there is really no allocation solution cannot be determined timely. All these may cause relatively long operation time for determining a target repair solution and make it impossible to implement optimal rapid allocation of a redundant circuit for repairing FBs.

Figure 1:
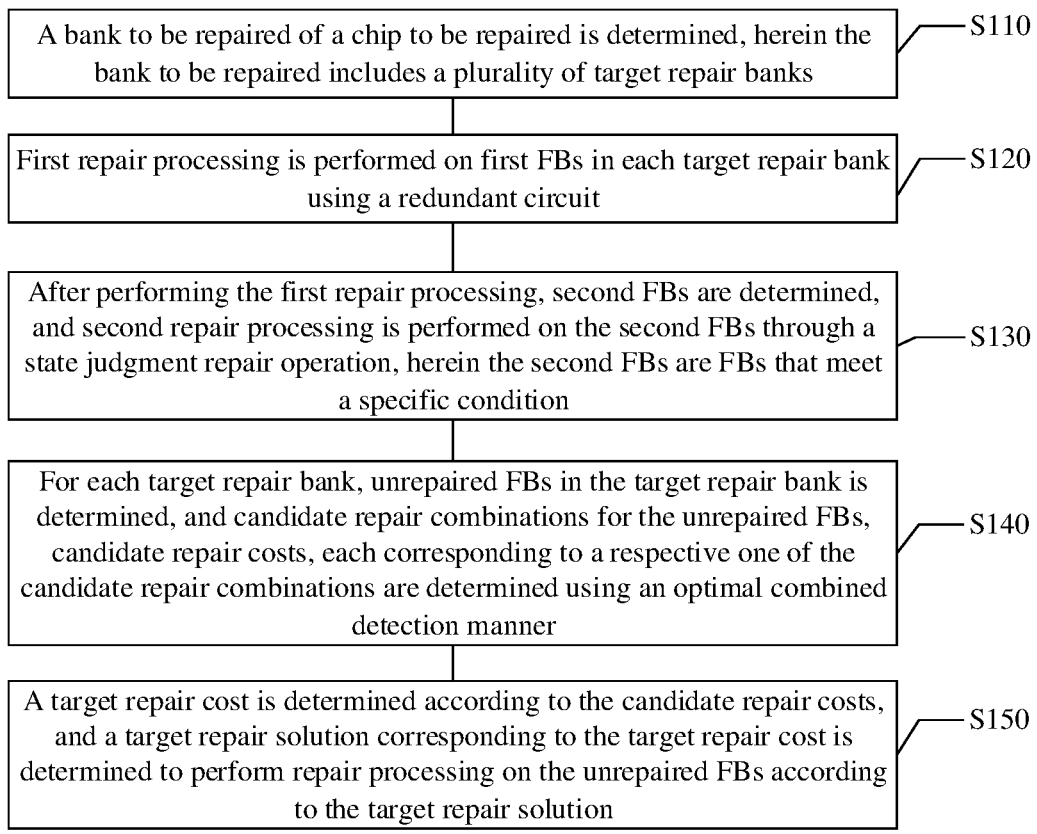
FIG. 1 schematically shows a flowchart of a method for FB repairing according to an exemplary implementation of the disclosure.

Based on this, in an exemplary embodiment, there is provided a method for FB repairing at first. FIG. 1 schematically shows a flowchart of a method for FB repairing according to some embodiments of the disclosure. Referring to FIG. 1, the method for FB repairing may include the following operations.

In S110, a bank to be repaired of a chip to be repaired is determined, herein the bank to be repaired includes a plurality of target repair banks.

In some exemplary embodiments of the disclosure, the chip to be repaired may be a chip with FBs in a cell region. The bank to be repaired may be a bank with FBs in a storage cell. A repair range of the bank to be repaired may usually be a half-bank. The target repair banks may be a plurality of banks formed after the bank to be repaired is divided. A bank to be repaired may be divided into a plurality of target repair banks.

When an optimal allocation method of redundant circuits for a certain repair range in the chip is determined, the chip to be repaired may be acquired at first, and a bank to be repaired of the chip to be repaired is determined for repair processing using a redundant circuit.

Figure 2:
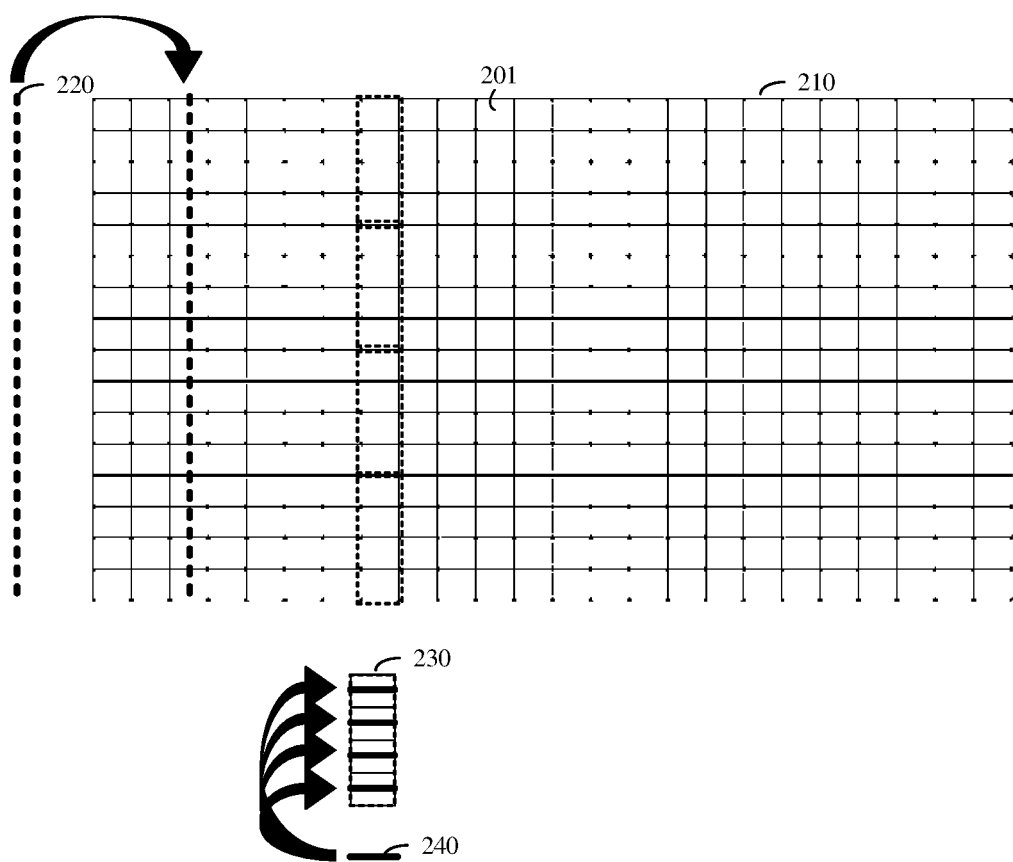
FIG. 2 schematically shows a circuit diagram of an initial bank to be repaired half-bank according to an exemplary implementation of the disclosure.

References are made to FIG. 2. FIG. 2 schematically shows a circuit diagram of an initial bank to be repaired half-bank according to an exemplary implementation of the disclosure. In FIG. 2, taking an initial bank to be repaired half-bank as an example, the initial bank to be repaired 210 may include a plurality of Data Queues (DQs) 201. Specifically, vertical and horizontal lines in the half-bank (210) may be represented by Word Lines (WLs) and Bit Lines (BLs) respectively. For example, a length of the WL may be continuous bits of 16 vertical continuous DQs, and a length of the BL may be continuous bits of one horizontal DQ. Rules for allocating redundant circuits to repair FBs are as follows. For RWLs 220, a repair range 210, i.e., a half-bank includes $N_{RWL}$ RWLs. One RWL may be allocated to repair any WL in the half-bank, and a width of an RWL may be $w^{RWL}$ bits. For RBLs 240, vertical 4-DQ may be determined as a repair range 230, namely four continuous DQs may be determined as a repair range, every 4-DQ includes $N_{RBL}$ RBLs, and allocating the RBLs to repair BLs meets an appositional repair rule, namely one RBL may be allocated to repair any BL in the corresponding 4-DQ, BLs at the same positions in other DQs may also be repaired together, and allocated repair over non-corresponding 4-DQs is not allowed. A width of an RBL may be $w_{RBL}$ bits.

It is to be noted that specific numerical values of $N_{RWL}$, $N_{RBL}$, $w^{RWL}$, and $w^{RBL}$ in the disclosure are determined according to a product feature of the chip, and no special limits are made thereto in the disclosure.

According to some exemplary embodiments of the disclosure, an initial bank to be repaired of the chip to be repaired is determined, the initial bank to be repaired includes an initial WL and an initial BL. A WL compression ratio and BL compression ratio of the initial bank to be repaired are acquired. Compression is performed on the initial WLs according to the WL compression ratio, and compression is performed on the initial BLs according to the BL compression ratio, to form the bank to be repaired. The initial bank to be repaired may be a repair bank determined when repair processing is performed on the chip to be repaired. The initial WLs may be WL circuits in the initial bank to be repaired. The initial BLs may be BL circuits in the initial bank to be repaired. The WL compression ratio may be a compression ratio adopted for performing compression on the initial WLs in the initial bank to be repaired. The BL compression ratio may be a compression ratio adopted for performing compression on the initial BLs in the initial bank to be repaired. The bank to be repaired may be a repair bank formed after compression is performed on the initial bank to be repaired.

Figure 3:
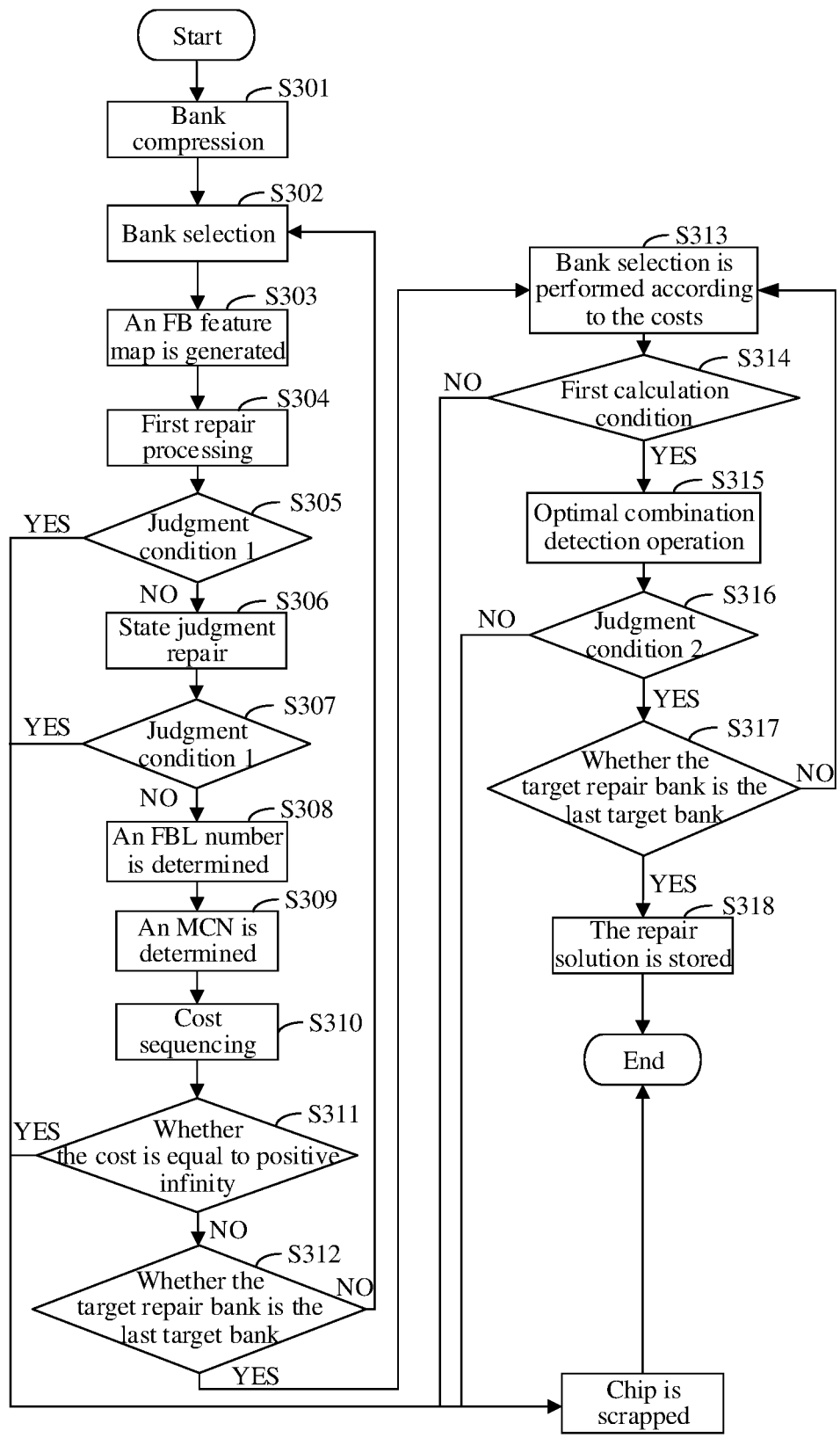
FIG. 3 schematically shows an overall flowchart of an optimal rapid FB repair method according to an exemplary implementation of the disclosure.
Figure 4:
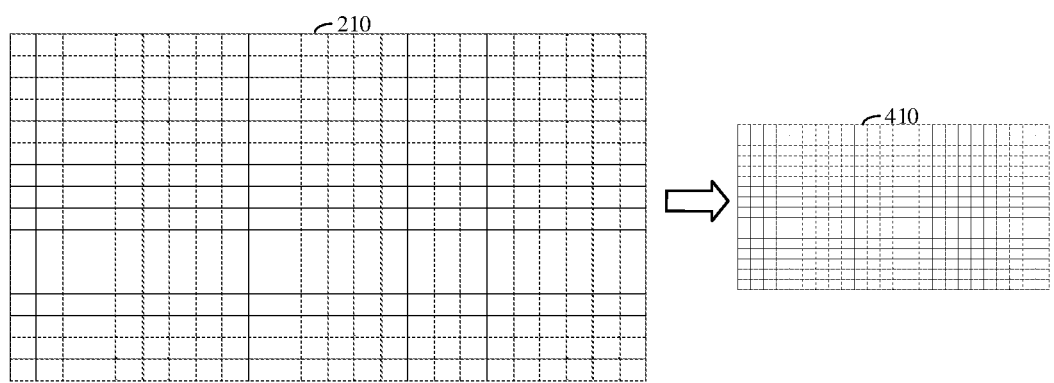
FIG. 4 schematically shows a change diagram of performing compression on an initial bank to be repaired to form a bank to be repaired according to an exemplary implementation of the disclosure.

References are made to FIG. 3. FIG. 3 schematically shows an overall flowchart of an optimal FB repair solution determination method according to an exemplary implementation of the disclosure. Before repair processing is performed on the chip to be repaired, for weakening the factor of the widths of the RWL and the RBL to make it unnecessary to consider the width of the redundant circuit during subsequent processing, in S301, compression may be performed on the initial bank to be repaired to form the bank to be repaired for a repair processing process. References are made to FIG. 4. FIG. 4 schematically shows a change diagram of performing compression on an initial bank to be repaired to form a bank to be repaired according to an exemplary implementation of the disclosure. For example, the WL compression ratio and the BL compression ratio may be configured as $w^{RWL}$ and $w^{RBL}$ respectively. In FIG. 4, compression is performed on the initial WLs and initial BLs in the initial bank to be repaired 210 according to the WL compression ratio $w^{RWL}$ and the BL compression ratio $w_{RBL}$ respectively. When compression is performed, an OR operation may be performed. A value of an FB may be 1, and a value of a non-FB may be 0. After compression is performed on the initial bank to be repaired 210, the bank to be repaired 410 may be formed, and the bank to be repaired is recorded as U . Performing the abovementioned compression process on the initial bank to be repaired to form the bank to be repaired may greatly reduce the count of bits in the original half-bank, reduce the processing time, and improve the processing efficiency.

According to some exemplary embodiments of the disclosure, a division column for the bank to be repaired is determined, a width of the division column is determined according to a row-direction equivalent bit count in a compressed DQ. Column division is performed on the bank to be repaired according to the division column to form the plurality of target repair banks. The division column may be a basic division unit adopted when division is performed on the initial bank to be repaired. The row-direction equivalent bits may be bits in each row in the DQ in the bank to be repaired formed after compression is performed on the initial bank to be repaired.

Figure 5:
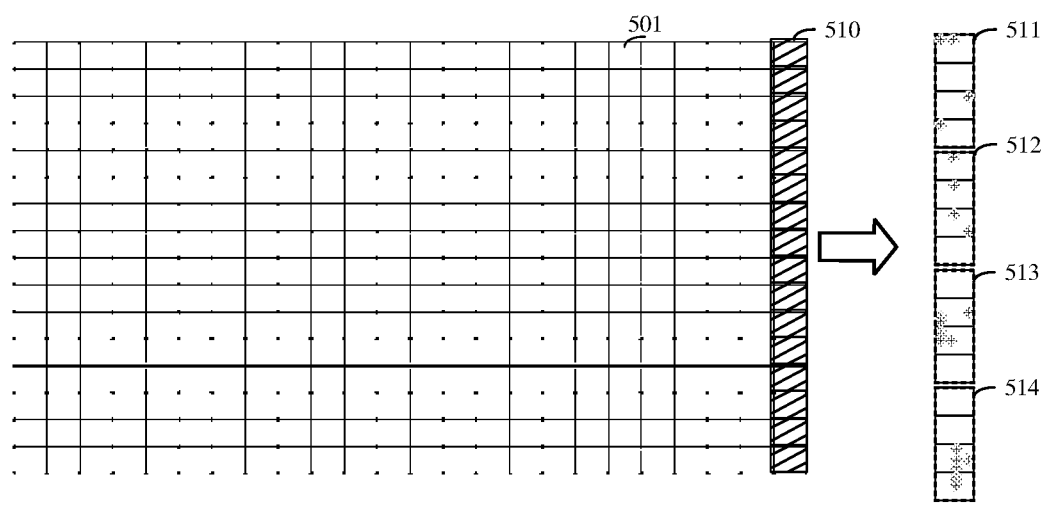
FIG. 5 schematically shows an FB map of a target repair bank according to an exemplary implementation of the disclosure.

References are made to FIG. 5. FIG. 5 schematically shows an FB map of a target repair bank according to an exemplary implementation of the disclosure. In FIG. 5, the bank to be repaired 510 may include a plurality of DQs 501. For example, in the disclosure, the division column for the bank to be repaired may be determined according to the width of the row-direction equivalent bits in the DQ. For example, a width of a vertical DQ 501 may be determined as the width of the division column, and all vertical DQs may be divided into a target repair bank. After the bank to be repaired is divided according to the division column, the target repair bank may be a bank formed by one row-direction DQ and all the vertical DQs. When column division is performed on the bank to be repaired according to the width of a row-direction equivalent bit, the bank to be repaired may be divided into the plurality of target repair banks 510 to perform repair processing based on the target repair banks, so that the complexity of performing repair processing on the FBs using the redundant circuit may be reduced.

In S120, first repair processing is performed on first FBs in each target repair bank using a redundant circuit.

In some exemplary implementations of the disclosure, the redundant circuit may include RWLs and RBLs. First repair processing may be a process of performing repair processing on FBs using the RWLs and the RBLs after the FBs in the target repair bank is determined. The first repair processing, also called Must Repair (MR), may represent a repair process that one of the RBL or the RWL must be used for repair and cannot be replaced with the other.

Referring to FIG. 5, repair processing may be performed on the target repair banks one by one. For example, banks to be processed 510, i.e., banks $A_r$, r=1,2, . . . ,n, may be sequentially selected from right to left, n being the count of the target repair banks, and repair processing is performed on the target repair banks $A_r$ one by one. FB may be adopted to represent a fail bit in the target repair bank, namely a value thereof is 1, and non-FB may be adopted to represent a not fail bit in the target repair bank, namely a value thereof is 0.

According to some exemplary embodiments of the disclosure, an FB feature map of the target repair bank is determined. First repair processing is performed on FBs in each target repair bank using an RWL and/or an RBL according to the FB feature map. The FB feature map may be a feature map obtained after performing abstract extraction on the FBs in the target repair bank.

Referring to FIG. 3, in S302, one target repair bank may be selected after the plurality of target repair banks are generated. In S303, an FB feature map of the target repair bank is generated. In S304, first repair processing is performed on the FBs in the target repair bank using the RWL and/or the RBL according to the FB feature map.

According to some exemplary embodiments of the disclosure, the target repair bank is divided into a plurality of basic repair banks, the basic repair bank includes a preset count of DQs. The basic repair banks are acquired, and bit states of all bits in the basic repair banks are determined. For each of the preset count of DQs, OR operation is performed on the bit states of the bits in a respective one of the DQ, and results of the OR operations for the preset count of DQs are combined to generate an FB map of the basic repair banks. The FB feature map is generated according to the generated FB maps, each corresponding to a respective one of the basic repair banks. The basic repair banks may be repair banks formed after bank division is performed on the target repair bank. The basic repair bank may include a preset count of DQs, and the preset count may be set according to a division requirement. For example, the preset count may be configured to 2, 4, and 8, etc. No special limits are made thereto in the disclosure. The bit state may represent that each bit in the basic repair bank is in a valid state or an invalid state. The FB map may be a feature map corresponding to each FB in the basic repair bank.

When an RBL is adopted for repair processing, the appositional repair rule is met, namely one RBL may be allocated to repair any BL in the corresponding 4-DQ. Therefore, the preset count may be configured to 4, and four DQs are determined as a basic repair bank. For example, every four DQs may be determined as a basic repair bank, and $B_{ri}$ may be adopted to represent the basic repair bank, namely ith 4-DQ in $A_r$. When a target repair bank is determined, the target repair bank may be divided into a plurality of basic repair banks, and bit states of all bits in each basic repair bank are determined one by one. Referring to FIG. 5, "+" may be adopted to represent the FBs in the basic repair bank. After the target repair bank 510 is divided, four basic repair banks are obtained, i.e., basic repair bank 511, basic repair bank 512, basic repair bank 513, and basic repair bank 514.

Figure 6:
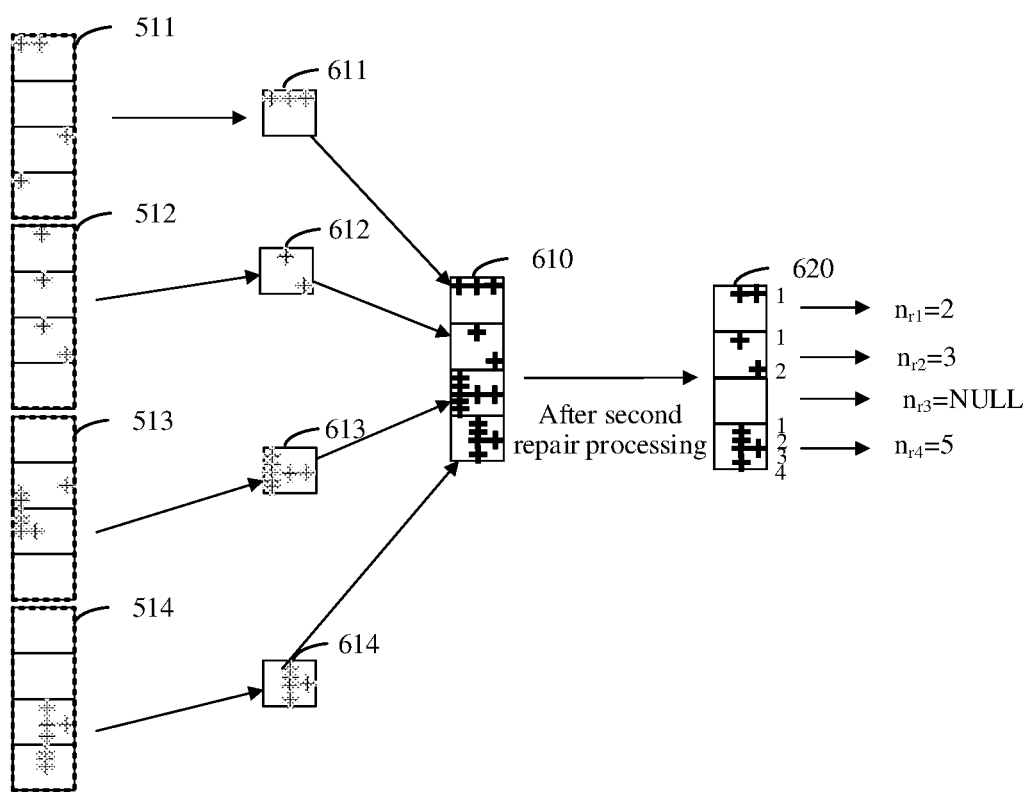
FIG. 6 schematically shows a generated FB feature map of a target repair bank according to an exemplary implementation of the disclosure.

When bit states in each basic repair bank are determined, OR operation may be performed on the bit states in a basic repair bank, including 0 OR 0=0, 0 OR 1=1, 1 OR 0=1, and 1 OR 1=1. For $\forall B_{ri} \in A_r$, the OR operation may be performed on each DQ in $B_{ri}$ to obtain an FB map, recorded as $M_{ri}$, until such processing is performed on all $B_{ri}$ in $A_r$. References are made to FIG. 6. FIG. 6 schematically shows a generated FB feature map of a target repair bank according to an exemplary implementation of the disclosure. OR operation may be performed on FBs in basic repair bank 511 to basic repair bank 514 respectively to obtain corresponding FB maps, i.e., FB map 611, FB map 612, FB map 613, and FB map 614 respectively. An FB feature map 610 corresponding to the target repair bank may be generated according to the FB map of each basic repair bank.

According to some exemplary embodiments of the disclosure, whether the FB feature map meets a preset condition is determined, the preset condition includes a first preset condition and a second preset condition. Responsive to that the FB feature map meets the first preset condition, repair processing is performed on the FBs using the RWLs, the first preset condition includes that an FB count of a first number WL in the basic repair bank is larger than a present left RBL count in the basic repair bank. Responsive to that the FB feature map meets the second preset condition, repair processing is performed on the FBs using the RBLs, the second preset condition includes that an FB count of a first number BL in the basic repair bank is larger than a present left RWL count in the basic repair bank. The preset condition may be a condition for determining the redundant circuit to be adopted to repair the target repair bank according to the FB feature map corresponding to the target repair bank. When repair processing is performed on the FBs, two redundant circuits, i.e., the RWL and the RBL, may be adopted for repair processing. The first preset condition, i.e., phenomenon 1, may be a corresponding preset condition when the RWL is adopted to perform repair processing on the FBs. The second preset condition, i.e., phenomenon 2, may be a corresponding preset condition when the RBL is adopted to perform repair processing on the FBs. The FB count of the first number WL may be the count of FBs in a jth WL in $M_{ri}$, recorded as $N_{ij}^{FWL}$. The present left RBL count in the basic repair bank may be the count of present available RBLs in $M_{ri}$, recorded as $N_{ri}^{RBL}$. The FB count of the first number BL may be the count of FBs in a jth BL in $M_{ri}$, recorded as $N_{ij}^{FBLs}$. The present left RWL count may be the count of present left available RWLs, recorded as $N_{RWL}^{(t)}$.

Figure 7:
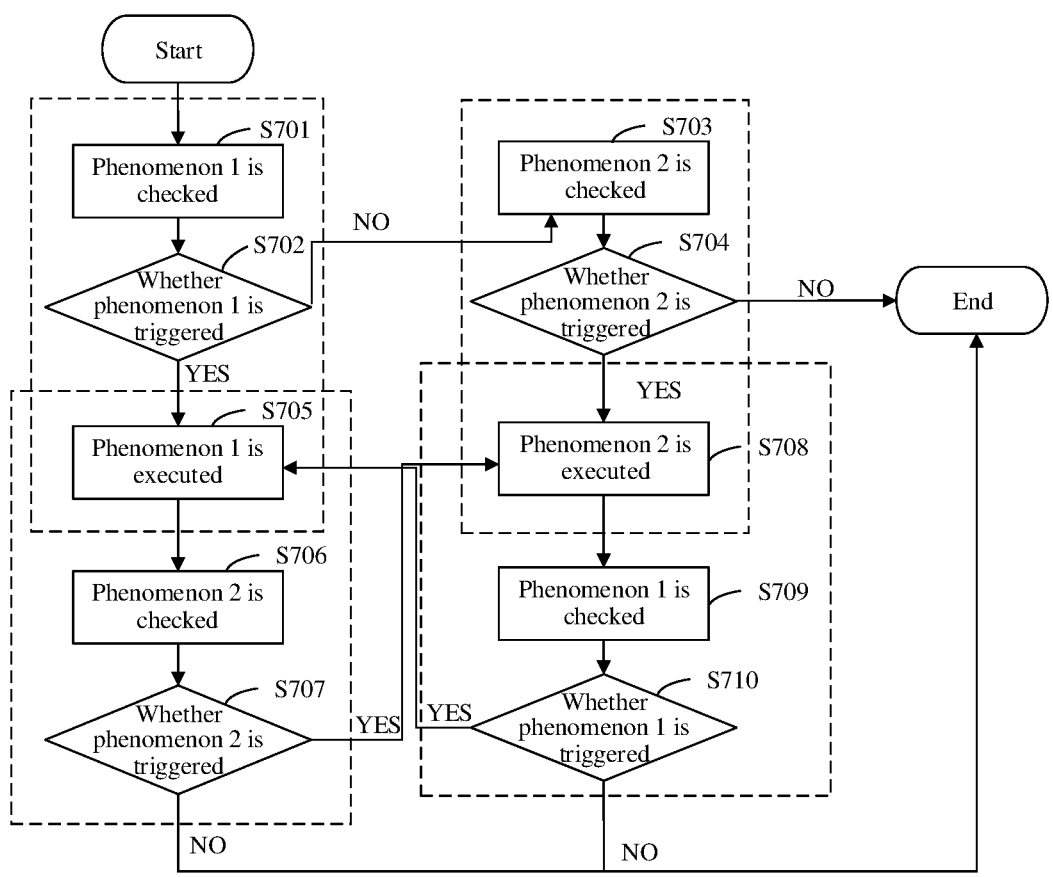
FIG. 7 schematically shows a flowchart of first repair processing according to an exemplary implementation of the disclosure.

When the FB feature map of the target repair bank is obtained, first repair processing may be performed on the FBs in the target repair bank using the RWLs and/or the RBLs, namely Force Repair (FR) processing is performed. Referring to FIG. 7, FIG. 7 schematically shows a flowchart of first repair processing according to an exemplary implementation of the disclosure, the following operations are specifically executed.

In S701 to S702, whether the determined FB feature map meets the first preset condition is determined. If the FB feature map does not meet the first preset condition, namely phenomenon 1 is not triggered, S703 to S704 are executed, and whether phenomenon 2 is triggered is determined. If it is determined that the FB feature map meets the first preset condition, namely phenomenon 1 is triggered, S705 is executed, namely WL repair processing is performed on the target repair bank. Specifically, the first preset condition may be that the FB count of the first number WL in the basic repair bank is larger than the present left RBL count in the basic repair bank. For each basic repair bank in the target repair bank, namely $N_{ij}^{FWL} \in \forall M_{ri}$, when $N_{ij}^{FWL} > N_{ri}^{FBL}$, the WL at corresponding position j is repaired using the RWL. When WL repair is performed using the RWL, the present left RWL count correspondingly decreases by 1, so the present left RWL count may be correspondingly updated when WL repair is performed, namely $N_{RWL}^{(t+1)} = N_{RWL}^{(t)} - n_{RWL}^{(t)}$, where $N_{RWL}^{(t)}$ represents the count of the left available RWLs, t represents a present variable, t+1 represents a next variable, and $n_{RWL}^{(t)}$ may represent the count of RWLs that have been used in the target repair bank. If $N_{RWL}^{(t+1)} < 0$, it indicates that there is no available RWL, and no RWL may be adopted for WL repair processing. In S706, whether the FB feature map meets the second preset condition may be continued to be determined.

In S707, if the FB feature map meets the second preset condition, namely phenomenon 2 is triggered, S708 is executed, namely BL repair processing is performed on the target repair bank. Specifically, the second preset condition may be that the FB count of the first number BL in the basic repair bank is larger than the present left RWL count in the basic repair bank. For each basic repair bank in the target repair bank, namely $N_{ij}^{FBLs} \in \forall M_{ri}$, when $N_{ij}^{FBLs} > N_{RWL}^{(t)}$, the WL at corresponding position j is repaired using the RBL. When WL repair is performed using the RBL, the present left RBL count correspondingly decreases by 1, so the present left RBL count may be correspondingly updated when WL repair is performed, namely $N_{RWL}^{(t+1)} = N_{RWL}^{(t)} - n_{RWL}^{(t)}$, where $N_{RWL}^{(t)}$ represents the count of the left available RWLs, t represents the present variable, t+1 represents the next variable, and $n_{RWL}^{(t)}$ may represent the count of the RWLs that have been used in the target repair bank. If $N_{RWL}^{(t+1)} < 0$, it indicates that there is no available RWL, and no RWL may be adopted for WL repair processing. Whether the FB feature map meets the second preset condition may be continued to be determined. $N_{RBL}^{(t+1)} = N_{RBL}^{(t)} - n_{RBL}^{(t)}$, where $N_{RBL}^{(t)}$ represents the count of the left available RWLs, t represents the present variable, t+1 represents the next variable, and $n_{RBL}^{(t)}$ may represent the count of RBLs that have been used in the target repair bank. If $N_{RBL}^{(t+1)} < 0$, it indicates that there is no available RBL, and no RBL may be adopted for WL repair processing. In such case, in S709, whether the FB feature map meets the first preset condition may be continued to be cyclically determined, and if the FB feature map meets the first preset condition, namely phenomenon 1 is triggered, S710 is executed. Whether the FB feature map meets the first preset condition and the second preset condition is cyclically determined to perform repair processing on the FBs in the target repair bank.

Before searching and determining all possible candidate repair combinations, repair processing is performed on first FBs in the chip to be repaired by FR. If more FBs are repaired by FR, a candidate combination count of all the possible candidate repair combinations may be reduced greatly, so the operation cost may be reduced greatly.

It is to be noted that some chips to be repaired have been repaired after initial repair processing, i.e., FR processing, and thus do not need subsequent operations, and for chips that are not completely repaired after first repair processing, repair operations after initial repair processing are required to be continued. For a chip that is not completely repaired after first repair processing, the following processing operations may be continued to be executed.

In S130, after performing the first repair processing, second FBs are determined, and second repair processing is performed on the second FBs through a state judgment repair operation, herein the second FBs are FBs that meet a specific condition.

In some exemplary embodiments of the disclosure, the second FBs may be FBs that are not repaired after first repair processing and meet some preset state conditions. The state judgment repair operation may be a process of determining a preset judgment state that a bank feature map state of the target repair bank is consistent with and repairing the FBs according to a judgment state repair operation corresponding to the matched judgment state. Specifically, bit positions of the second FBs are acquired, and the second FBs are repaired by second repair processing. Second repair processing, also called optimal must repair, may be a process that positions of some FBs may be directly determined to be repaired using the RBLs or the RWLs when some state conditions are met, and this repair solution is definitely optimal.

Figure 8:
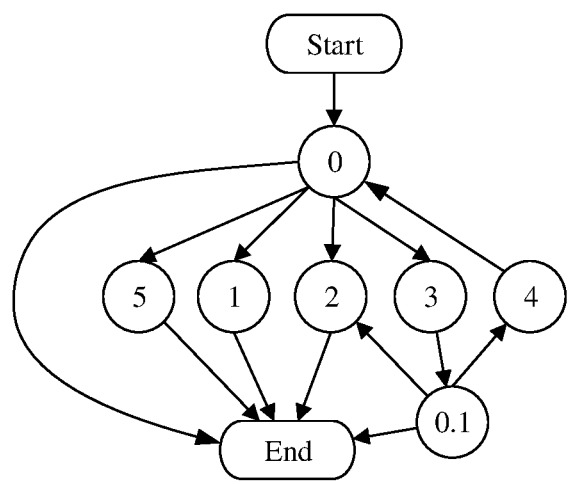
FIG. 8 schematically shows a state diagram of state judgment repair processing according to an exemplary implementation of the disclosure.

Referring to FIG. 3, in S305, whether the target repair bank meets judgment condition 1 may be determined. Judgment condition 1 may be that $N_{RWL}^{(t+1)} < 0$. If the target repair bank meets judgment condition 1, the chip to be repaired may be determined as a fail chip. If the target repair bank does not meet judgment condition 1, S306 is executed, namely the state judgment repair processing operation is executed on the target repair bank. References are made to FIG. 8. FIG. 8 schematically shows a state diagram of state judgment repair processing according to an exemplary implementation of the disclosure. A specific state corresponding to a state that the bank feature map corresponding to the target repair bank is consistent with in FIG. 8 may be determined to perform corresponding second repair processing on the FBs in the target repair bank. For example, a state set of bank feature map states may include a plurality of different judgment states such as 0, 0.1, 1, 2, 3, 4, and 5.

According to some exemplary embodiments of the disclosure, an FB feature map of the target repair bank is acquired, and a target FB count, an available RBL count, and a present left RWL count in the target repair bank are determined. Responsive to that the target repair bank meets an initial judgment condition, a repair processing operation for the chip to be repaired is ended, the initial judgment condition includes that the target FB count is equal to 0, or the available RBL count is equal to 0, or the present left RWL count is less than 0. Responsive to that the target repair bank does not meet the initial judgment condition, segmentation processing is performed on the FB feature map according to an association relationship to generate a segmented feature map group, herein the segmented feature map group includes segmented feature maps. Responsive to that a bank feature map state of the target repair bank is a second initial state and a new FB feature map is generated in the segmented feature map group, the second initial state is adjusted to a first initial state.

A target repair bank $A_r$ may include one or more feature map groups, and the kth map group in $A_r$ may be represented by $G_{rk}$. Herein, a presently processed feature map group, i.e., a present feature map group, may be represented by $G_c$. A vector of FB counts summarized on all the WLs in the present feature map group in the target repair bank may be represented by $n_c^{FWL}$, and $n_{c+k}^{FWL}$ may represent a vector of FB counts summarized on all the WLs in the next kth feature map group in the target repair bank. The available RBL count may be the count of all RBLs in the present feature map group $G_c$, and may be represented by $N_{rc}^{TRBL}$, namely $$\sum_{M_{ri} \in G_c} N_{ri}^{RBL}.$$

Associated feature maps may refer to that, if there are unrepaired FBs at the same WL position in any two feature maps, it may be considered that the two feature maps are associated, otherwise they are unassociated. A spuriously associated feature map may refer to any associated map of which an RBL count is larger than an FBL count, namely the RBL count>=the FBL count. FBL may represent a BL including an FB. Segmentation processing may be a process of, for each map in the specified map group, independently forming a new map group by associated maps and independently forming a new map group by any unassociated or spuriously associated maps. The target FB count may be the count of all FBs in the present feature map group, and may be represented by $N_{rc}^{FB}$. The number of the FBL under operation may be represented by $n^{FBL}$. An index value of an FB of a certain BL in the feature map may be represented by $y_l^{FBL}$. The segmented feature map group may be a new feature map group generated after segmentation processing is performed on the FB feature map. The segmented feature map may be a feature map in the segmented feature map group, and a segmented feature map group may include one or more segmented feature maps. The bank feature map state may be a state corresponding to the FB feature map corresponding to the target repair bank.

After first repair processing, the FB feature map corresponding to each target repair bank subjected to first repair processing may be obtained, and the following processing is performed on each target repair bank. A target FB count $N_{rc}^{FB}$, an available RBL count $N_{rc}^{TRBL}$, and a present left RWL count $N_{RWL}^{(t)}$ corresponding to a target repair bank are acquired. If the target repair bank meets the initial judgment condition, the repair processing operation for the chip to be repaired is ended. The initial judgment condition may be that the target FB count $N_{rc}^{FB}$ is equal to 0, the available RBL count $N_{rc}^{TRBL}$ is equal to 0, or the present left RWL count $N_{RWL}^{(t)}$ is less than 0.

If the target repair bank does not meet the initial judgment condition, segmentation processing is performed on the FB feature map according to the association relationship to generate the segmented feature map group, namely each map group in the target repair bank is segmented according to the defined association relationship. If the bank feature map state of the target repair bank is the first initial state before segmentation processing, and a new segmented feature map group is generated after the segmentation processing operation, the bank feature map state of the target repair bank is adjusted from the second initial state to the first initial state. In the disclosure, the first initial state may be defined as a state corresponding to numerical value 0, and the second initial state may be defined as a state corresponding to numerical value 0.1. After segmentation processing is completed, the bank feature map state may further be determined. When the bank feature map state is the first initial state, whether the map of each group is consistent with specific state corresponding to numerical values 1, 2, 3, or 5 may be checked. If the bank feature map state is the second initial state, whether the map of each group is consistent with specific state corresponding to numerical values 2 or 4 may be checked. A corresponding repair operation is executed according to the state determined according to each bank feature map state, and if there is no state consistent with the bank feature map state, the repair processing operation for the chip to be repaired is ended.

Figure 9:
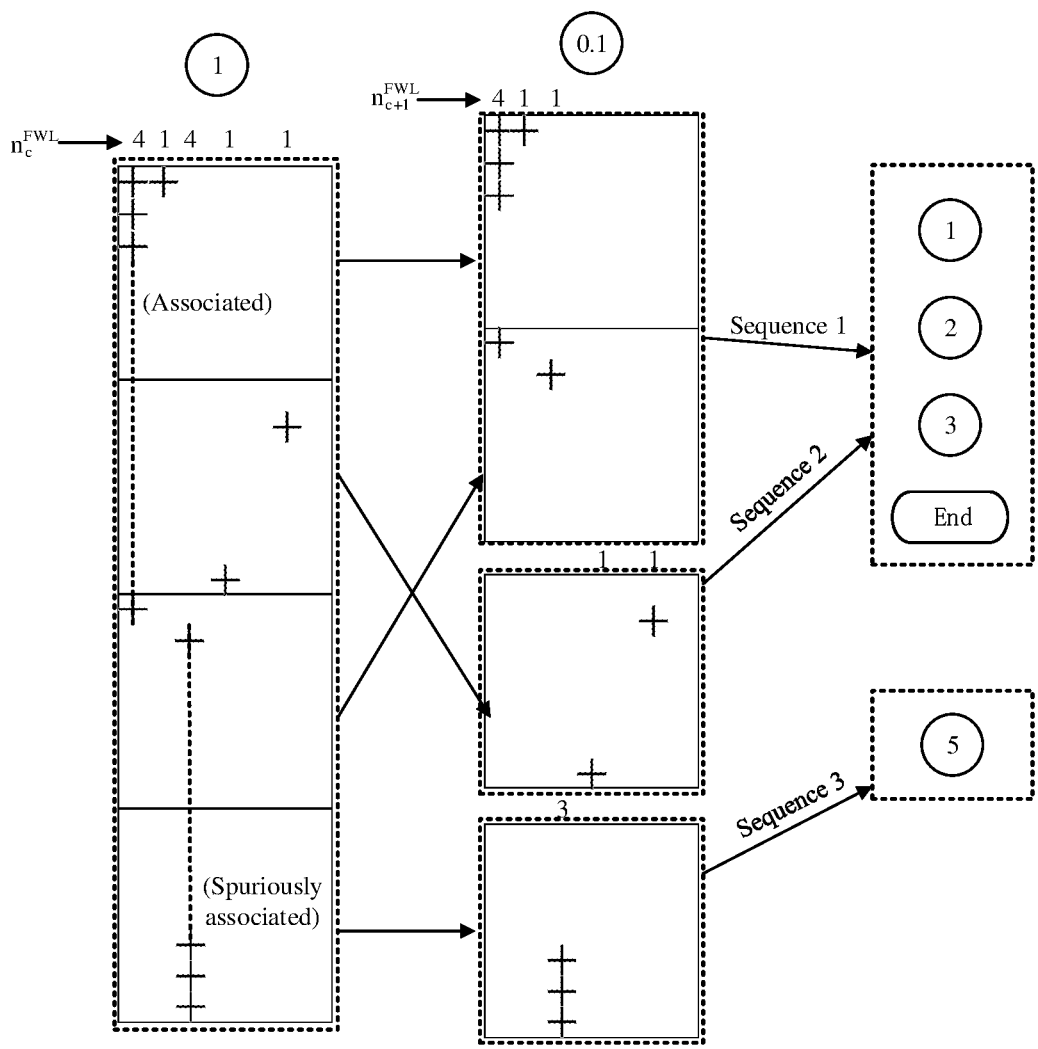
FIG. 9 schematically shows a process diagram of performing segmentation processing on a feature map group according to an exemplary implementation of the disclosure.

References are made to FIG. 9. FIG. 9 schematically shows a process diagram of performing segmentation processing on a feature map group according to an exemplary implementation of the disclosure. The corresponding segmentation processing is performed on a bank feature map that meets state=0.1, whether the state of the bank feature map may be switched to state=0 may be determined, a judgment state that the bank feature map is consistent with is further determined according to an initial state corresponding to the bank feature map state, and second repair processing is performed on the target repair bank according to the specific judgment state. A specific processing process is as follows.

According to some exemplary embodiments of the disclosure, if the bank feature map state is the first initial state, whether the bank feature map state is consistent with a first judgment state in a first state set is determined. Herein, the first judgment state includes that the available RBL count is greater than a first preset numerical value and a maximum WL FB count is equal to the first preset numerical value. If the bank feature map state is consistent with the first judgment state, a second repair processing operation in the first judgment state is executed. The second repair processing operation in the first judgment state includes: a repair operation in the first judgment state: a first maximum bit position corresponding to a first BL maximum FB in the segmented feature map is acquired, and the first initial repair processing operation is triggered to be executed to repair the FB at the first maximum bit position; and a determination operation in the first judgment state: whether the segmented feature map subjected to the repair operation in the first judgment state meets a first judgment condition is determined, the first judgment condition includes that the target FB count is greater than 0, the available RBL count is greater than 0, and a next left RWL count is greater than or equal to 0, and if the segmented feature map subjected to the repair operation in the first judgment state meets the first judgment condition, the repair operation in the first judgment state is executed.

The first preset numerical value may be a preset first numerical value. For example, the first preset numerical value may be 1. The first state set may be a set formed by states for comparison with the bank feature map state when the bank feature map state is the first initial state. The first judgment state may be a predefined judgment state. For example, the first judgment state may be a state corresponding to state=1. A vector of FB counts summarized on all the BLs in the present feature map group may be represented by $n_c^{FBL}$. A vector of FB counts summarized on all the WLs in the present feature map group may be represented by $n_c^{FWL}$. The maximum WL FB count may be a maximum value in $n_c^{FWL}$, and may be represented by $\max(n_c^{FWL})$. The first judgment state may be that the available RBL count is greater than the first preset numerical value and the maximum WL FB count is equal to the first preset numerical value, namely $N_{rc}^{TRBL}>1$ and $\max(n_c^{FWL})=1$. The second repair processing operation in the first judgment state may be a repair operation for the target repair bank when the bank feature map state is consistent with the first judgment state. The first BL maximum FB may be a maximum value of an FB BL position number in $n_c^{FWL}$, and may be represented by $Y_c^{Max}$, where $Y_c^{Max}$ is arg max f $(y_l)$, $f(y_l)=(n_{c,y_l}^{FBL} | n_{c,y_l}^{FBL} \in n_c^{FBL})$. The first maximum bit position is a position corresponding to $Y_c^{Max}$.

Figure 10:
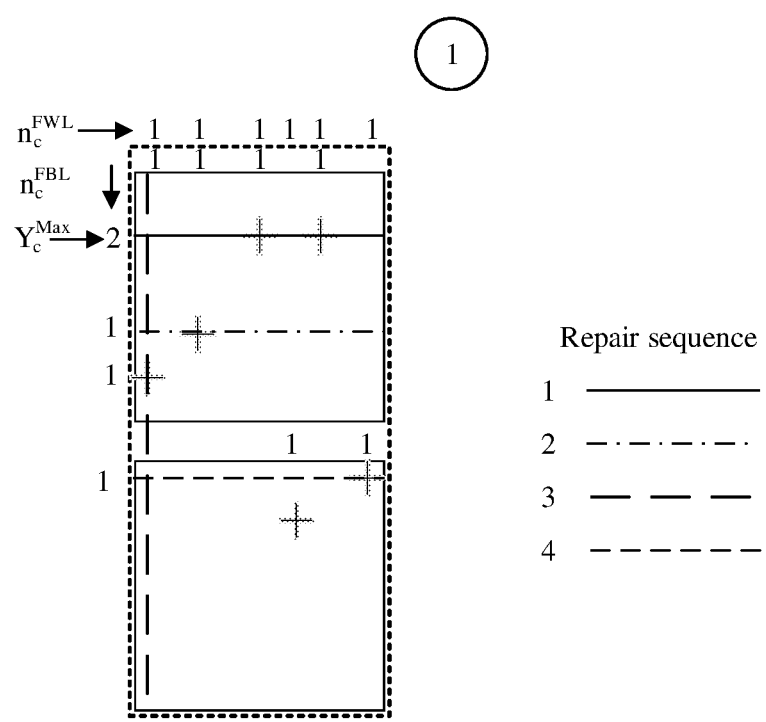
FIG. 10 schematically shows an FB feature map consistent with a first judgment state according to an exemplary implementation of the disclosure.

References are made to FIG. 10. FIG. 10 schematically shows an FB feature map consistent with a first judgment state according to an exemplary implementation of the disclosure. The FB feature map in FIG. 10 is consistent with the first judgment state. If the bank feature map state is consistent with the first judgment state, the second repair processing operation in the first judgment state is executed, including the repair operation in the first judgment state and the determination operation in the first judgment state. The following operations are specifically executed. Operation 1, the first maximum bit position in the segmented feature map is acquired. Operation 2, the first initial repair processing operation is triggered to be executed to repair the FB at the first maximum bit position. Operation 3, whether the segmented feature map subjected to the repair operation in the first judgment state meets the first judgment condition is determined. The first judgment condition may be that the target FB count is greater than 0, the available RBL count is greater than 0, and the next left RWL count is greater than or equal to 0, namely $N_{rc}^{FB}>0$, $N_{rc}^{TRBL}>0$, and $N_{RWL}^{(t+1)} \geq 0$. When the segmented feature map meets the first judgment condition, operation 1 is continued to be executed, otherwise the state is terminated.

According to some exemplary embodiments of the disclosure, if the bank feature map state is the first initial state, whether the bank feature map state is consistent with a second judgment state in the first state set is determined. Herein, the second judgment state includes that the available RBL count is equal to the first preset numerical value. If the bank feature map state is consistent with the second judgment state, a second repair processing operation in the second judgment state is executed. The second repair processing operation in the second judgment state includes that: the first maximum bit position corresponding to the first BL maximum FB in the segmented feature map is acquired, and the first initial repair processing operation is triggered to be executed to repair the FB at the first maximum bit position. The second judgment state may be a predefined judgment state. For example, the second judgment state may be a state corresponding to state=2. The second judgment state may be that the available RBL count is equal to the first preset numerical value, namely $N_{rc}^{TRBL}=1$.

Figure 11:
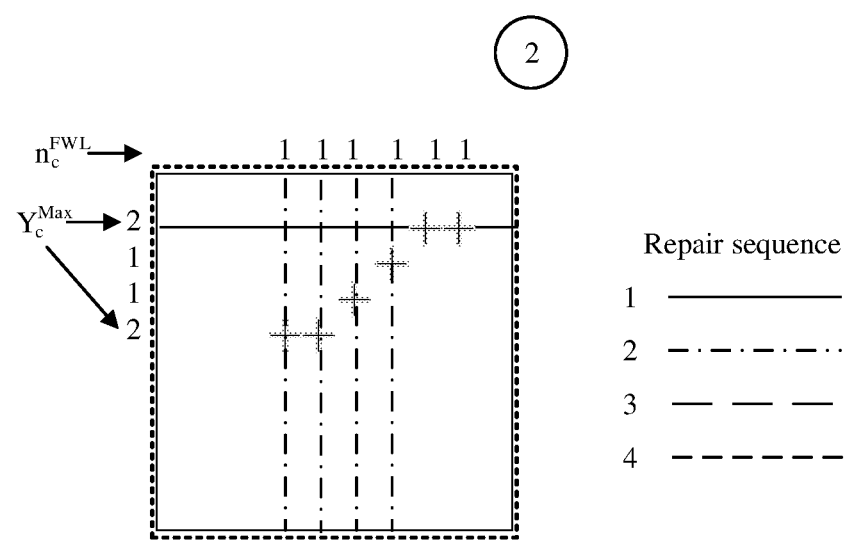
FIG. 11 schematically shows an FB feature map consistent with a second judgment state according to an exemplary implementation of the disclosure.

References are made to FIG. 11. FIG. 11 schematically shows an FB feature map consistent with a second judgment state according to an exemplary implementation of the disclosure. The FB feature map in FIG. 11 is consistent with the second judgment state. If the bank feature map state is consistent with the second judgment state, the second repair processing operation in the second judgment state is executed, including the following operations. Operation 1, the first maximum bit position corresponding to the first BL maximum FB in the segmented feature map is acquired. Operation 2, the first initial repair processing operation is triggered to be executed to repair the FB at the first maximum bit position. Operation 3, the state is terminated.

According to some exemplary embodiments of the disclosure, if the bank feature map state is the first initial state, whether the bank feature map state is consistent with a third judgment state in the first state set is determined. Herein, the third judgment state includes that the available RBL count is greater than the first preset numerical value and the maximum WL FB count is greater than the first preset numerical value. If the bank feature map state is consistent with the third judgment state, a second repair processing operation in the third judgment state is executed. The second repair processing operation in the third judgment state includes: a repair operation in the third judgment state: the first maximum bit position corresponding to the first BL maximum FB and a second maximum bit position corresponding to the second BL maximum FB in the segmented feature map are acquired respectively, and if the maximum bit position and the second maximum bit position include the same position, the first initial repair processing operation is triggered to be executed to repair an FB at the same position; and a determination operation in the third judgment state: whether the segmented feature map subjected to the repair operation in the third judgment state meets a third judgment condition, the third judgment condition includes that the target FB count is greater than 0, the available RBL count is greater than the first preset numerical value, and the next left RWL count is greater than or equal to 0, and if the segmented feature map subjected to the repair operation in the third judgment state meets the third judgment condition, the repair operation in the third judgment state is executed.

The third judgment state may be a predefined judgment state. For example, the third judgment state may be a state corresponding to state=3. The third judgment state may be that the available RBL count is greater than the first preset numerical value and the maximum WL FB count is greater than the first preset numerical value, namely $N_{rc}^{TRBL}>1$ and $\max(n_c^{FWL})>1$. The second BL maximum FB may be a certain BL in the present feature map group, and there will be the maximum and increase count of 0s in $n_c^{FWL}$ if the certain BL has been repaired, i.e., the second BL maximum FB is a BL including most FBs in the present feature map group, and may be represented by $Y_c^{MDx}$. The same position may be an overlapping position of the first maximum bit position and the second maximum bit position.

Figure 12:
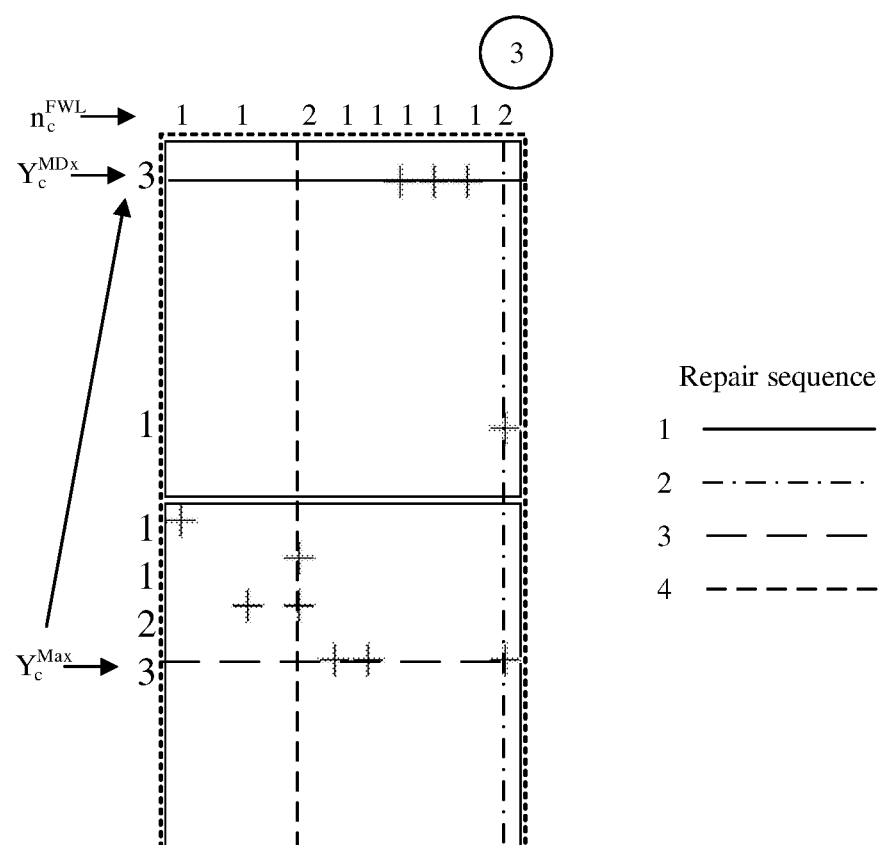
FIG. 12 schematically shows an FB feature map consistent with a third judgment state according to an exemplary implementation of the disclosure.

References are made to FIG. 12. FIG. 12 schematically shows an FB feature map consistent with a third judgment state according to an exemplary implementation of the disclosure. The FB feature map in FIG. 12 is consistent with the third judgment state. If the bank feature map state is consistent with the third judgment state, the second repair processing operation in the third judgment state is executed, including the repair operation in the third judgment state and the determination operation in the third judgment state. The following operations are specifically executed. Operation 1, the first maximum bit position corresponding to the first BL maximum FB and the second maximum bit position corresponding to the second BL maximum FB in the segmented feature map are acquired respectively, namely the FBs at positions corresponding to $Y_c^{Max}$ and $Y_c^{MDx}$ are acquired respectively. Operation 2, whether the first maximum bit position and the second maximum bit position include the same position is determined, namely whether $Y_c^{Max} \cap Y_c^{MDx} \neq \{\}$ is met is determined. If the positions corresponding to $Y_c^{Max}$ and $Y_c^{MDx}$ include the same position, one position is selected, and the first initial repair processing operation is triggered to be executed to repair the FB corresponding to the position. Otherwise, the state is terminated. Operation 3, whether the segmented feature map subjected to the repair operation in the third judgment state meets the third judgment condition is determined. The third judgment condition includes that the target FB count is greater than 0, the available RBL count is greater than the first preset numerical value, and the next left RWL count is greater than or equal to 0, namely the third judgment condition may be $N_{rc}^{FB}>0$, $N_{rc}^{TRBL}>0$, and $N_{RWL}^{(l+1)} \geq 0$. When the segmented feature map meets the third judgment condition, operation 1 is continued to be executed, otherwise the state is terminated.

According to some exemplary embodiments of the disclosure, if the bank feature map state is the second initial state, whether the bank feature map state is consistent with a fourth judgment state in a second state set is determined. Herein, the fourth judgment state includes that the available RBL count is greater than the first preset numerical value and the maximum WL FB count is equal to a second preset numerical value, or the available RBL count is equal to the second preset numerical value and the maximum WL FB count is greater than the first preset numerical value. If the bank feature map state is consistent with the fourth judgment state, a second repair processing operation in the fourth judgment state is executed. The second repair processing operation in the fourth judgment state includes: a repair operation in the fourth judgment state: a third maximum bit position corresponding to a third BL maximum FB in the segmented feature map is acquired, and the first initial repair processing operation is triggered to be executed to repair the FB at the third maximum bit position; and a determination operation in the fourth judgment state: whether the segmented feature map subjected to the repair operation in the fourth judgment state meets a fourth judgment condition is determined, the fourth judgment condition including that the target FB count is greater than 0, the available RBL count is greater than the first preset numerical value, the FBL count is greater than the first preset numerical value, the next left RWL count is greater than or equal to 0, and the maximum WL FB count is equal to the second preset numerical value, and if the segmented feature map subjected to the repair operation in the fourth judgment state meets the fourth judgment condition, the second repair processing operation in the fourth judgment state is executed.

The fourth judgment state may be a predefined judgment state. For example, the fourth judgment state may be a state corresponding to state=4. The second preset numerical value may be a preset second numerical value. For example, the second preset numerical value may be 2. The fourth judgment state may be that the available RBL count is greater than the first preset numerical value and the maximum WL FB count is equal to the second preset numerical value, or the available RBL count is equal to the second preset numerical value and the maximum WL FB count is greater than the first preset numerical value, namely the fourth judgment state is $[N_{rc}^{TRBL}>1$ and $\max(n_c^{FWL})=2]$, or $[N_{rc}^{TRBL}=2$ and $\max(n_c^{FWL})>1]$. The third BL maximum FB may be some BLs in the present feature map group, and there will be the maximum and increase count of 0s in $n_c^{FWL}$ if lower of the BLs, one or two, has been repaired, and the third BL maximum FB may be represented by $Y_c^{MDx2}$. The third maximum bit position is a position corresponding to $Y_c^{MDx2}$. The FBL count may be the count of FBLs in the present feature map group, and may be represented by $N_c^{FBL}$.

Figure 13:
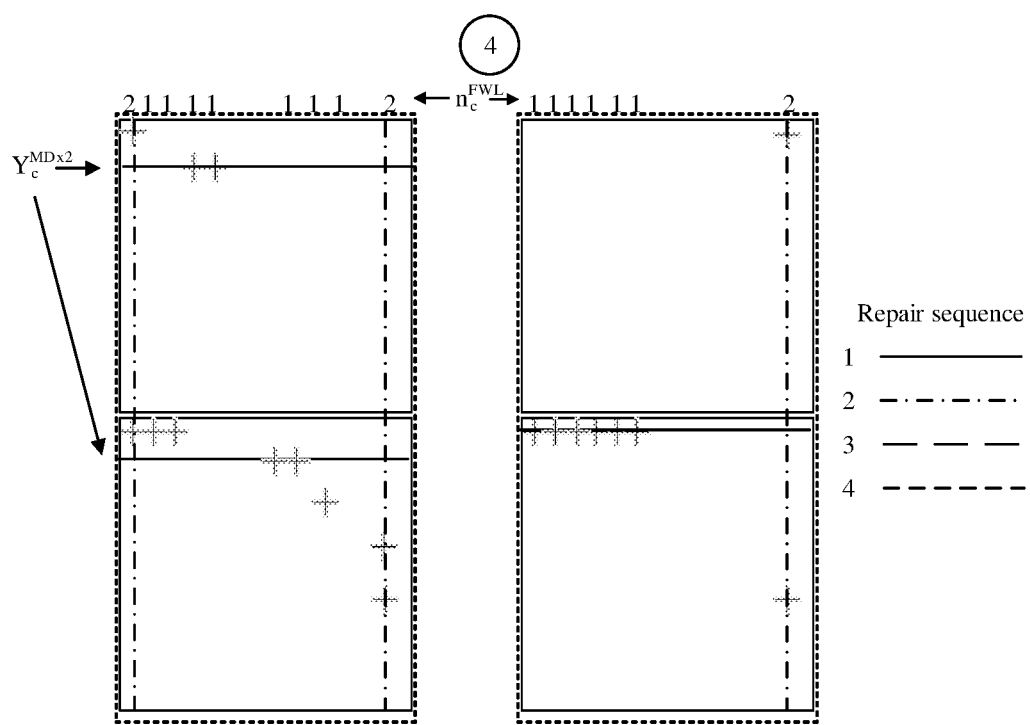
FIG. 13 schematically shows an FB feature map consistent with a fourth judgment state according to an exemplary implementation of the disclosure.

References are made to FIG. 13. FIG. 13 schematically shows an FB feature map consistent with a fourth judgment state according to an exemplary implementation of the disclosure. The FB feature map in FIG. 13 is consistent with the fourth judgment state. If the bank feature map state is consistent with the fourth judgment state, the second repair processing operation in the fourth judgment state is executed, including the repair operation in the fourth judgment state and the determination operation in the fourth judgment state. The following operations are specifically executed. Operation 1, the third maximum bit position corresponding to the third BL maximum FB in the segmented feature map is acquired. Operation 2, the first initial repair processing operation is triggered to be executed to repair the FB at the third maximum bit position. Operation 3, whether the segmented feature map subjected to the repair operation in the fourth judgment state meets the fourth judgment condition is determined. The fourth judgment condition includes that the target FB count is greater than 0, the available RBL count is greater than the first preset numerical value, the FBL count is greater than the first preset numerical value, the next left RWL count is greater than or equal to 0, and the maximum WL FB count is equal to the second preset numerical value, namely the fourth judgment condition may be $N_{rc}^{FB}>0$, $N_{rc}^{TRBL}>1$, $N_c^{FBL}>1$, $N_{RWL}^{(t+1)} \geq 0$, and $\max(n_c^{FWL})=2$. If the segmented feature map meets the fourth judgment condition, operation 1 is continued to be executed, otherwise the state is terminated.

According to some exemplary embodiments of the disclosure, if the bank feature map state is the first initial state, whether the bank feature map state is consistent with a fifth judgment state in the first state set is determined. Herein, the fifth judgment state includes that the RBL count in the basic repair bank is greater than or equal to the FBL count. If the bank feature map state is consistent with the fifth judgment state, a second repair processing operation in the fifth judgment state is executed. The second repair processing operation in the fifth judgment state includes that: a position of a used RWL is acquired, a target unrepaired FB is determined according to the position of the used RWL, the target unrepaired FB includes an FB at the position of the used RWL, and the target unrepaired FB is repaired using an RBL.

The fifth judgment state may be a predefined judgment state. For example, the fifth judgment state may be a state corresponding to state=5. The RBL count may be the count of RBLs in an ith feature map in the basic repair bank, and may be represented by $N_{ri}^{RBL}$. The FBL count may be the count of FBLs in the ith feature map in the basic repair bank, and may be represented by $N_{ri}^{RBL}$. The position of the used RWL may be a repaired RWL position. The target unrepaired FB may include an FB not at the position of the used RWL.

Figure 14:
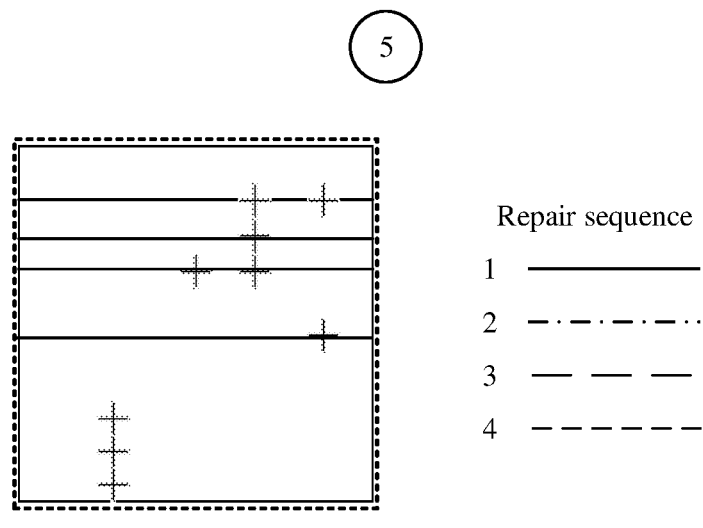
FIG. 14 schematically shows an FB feature map consistent with a fifth judgment state according to an exemplary implementation of the disclosure.

References are made to FIG. 14. FIG. 14 schematically shows an FB feature map consistent with a fifth judgment state according to an exemplary implementation of the disclosure. The FB feature map in FIG. 14 is consistent with the fifth judgment state. If the bank feature map state is consistent with the fifth judgment state, the second repair processing operation in the fifth judgment state is executed. The following operations are specifically executed. Operation 1, the position of the used RWL is acquired. Operation 2, the target unrepaired FB is determined according to the position of the used RWL, and the target unrepaired FB is repaired using the RBL. Operation 3, the state is terminated.

According to some exemplary embodiments of the disclosure, a repair priority of repair processing for the unrepaired FBs is determined, and the FBs is repaired according to the repair priority. The repair priority includes: a first repair priority: a new segmented feature map group is generated after segmentation processing is performed on the segmented feature map, and an RWL count of the segmented feature map after FB repair processing is greater than the first preset numerical value; a second repair priority: after repair processing is performed on the FBLs, the segmented feature map is segmented, and a new segmented feature map group is generated; a third repair priority: after repair processing is performed on the FBLs in the basic repair bank, the RWL count corresponding to the basic repair bank is equal to 0; a fourth repair priority: an FBL corresponding to a maximum number value in the first BL maximum FB, or an FBL corresponding to a maximum number value in the second BL maximum FB; a fifth repair priority: the target FWL, the target FWL is a maximum FWL corresponding to the larger number value in two maximum FWLs including FBL; a sixth repair priority: the FB corresponding to a maximum number value in the FBL; a seventh repair priority: an RBL configured to repair FBLs and corresponding to a minimum number value in the segmented feature map; and an eighth repair priority: a first one of FBs that is randomly determined. The repair priority may be a priority of repair processing for the unrepaired FBs, and different FBs correspond to different repair priorities. For example, the repair priorities may be set to progressively decrease from high to low priorities, namely the repair priority of the first repair priority is highest.

After the unrepaired FB is determined, repair processing may be performed on the unrepaired FB according to the repair priority. For example, the repair priority, including the first repair priority, the second repair priority to the eighth repair priority, may be predetermined in the disclosure. Processing the unrepaired FB using the repair priority may reduce the operation cost effectively.

In addition, before all possible candidate repair combinations are searched and determined, repair processing is performed on the second FBs in the chip to be repaired by optimal must repair. If more FBs are repaired by optimal must repair, the candidate combination count of all the possible candidate repair combinations may be reduced greatly, so the operation cost may be reduced greatly.

In S140, for each target repair bank, unrepaired FBs in the target repair bank is determined, and candidate repair combinations for the unrepaired FBs, candidate repair costs, each corresponding to a respective one of the candidate repair combinations are determined using an optimal combined detection manner.

In some exemplary embodiments of the disclosure, the unrepaired FBs may be FBs that are not repaired after second repair processing. The optimal combined detection manner may be a process of determining all candidate repair combinations for the unrepaired FBs, candidate repair costs, each corresponding to a respective one of the candidate repair combinations to determine the target repair solution. The candidate repair combinations may be all possible repair combinations corresponding to repair processing of the unrepaired FBs. The candidate repair cost may be a repair cost corresponding to repair processing of the unrepaired FBs using a solution corresponding to the candidate repair combination.

If there are still unrepaired FBs in the chip to be repaired after first repair processing and second repair processing, these FBs are determined as unrepaired FBs. Since allocated repair cannot be implemented on a position of an FB by optimal must repair through the state judgment repair operation in most cases that $\max(n_c^{FWL})>2$, after the unrepaired FBs are determined, all the candidate repair combinations of these unrepaired FBs may be determined using the optimal combined detection manner, and the candidate repair costs of the candidate repair combinations are determined to determine position allocation for optimal repair. Referring to FIG. 3, in S307, whether the target repair bank subjected to first repair processing and second repair processing meets judgment condition 1 may be continued to be determined. If the target repair bank meets judgment condition 1, the chip to be repaired may be determined as a fail chip. If the target repair bank subjected to second repair processing does not meet judgment condition 1, optimal repair processing is continued to be performed on the target repair bank.

According to some exemplary embodiments of the disclosure, the following operations are executed on each target repair bank. An FB feature map of the target repair bank subjected to second repair processing is acquired. FBLs are numbered according to the FB feature map to generate FBL numbers. A Map Combination Number (MCN) of the FB feature map is generated according to the FBL numbers. A bank repair cost of the target repair bank is calculated according to the MCN. The FBL number may be a number corresponding to each FBL after numbering a BL corresponding to the FB in the target repair bank subjected to second repair processing. The MCN may be a number determined according to the FBL number and corresponding to a feature map of each basic repair bank. The MCN is for facilitating hybrid carry-based operation.

The FB feature map of the target repair bank is acquired. Referring to FIG. 3, in S308, the FBLs of the basic repair bank in the target repair bank subjected to second repair processing may be numbered according to the FB feature map. Specifically, for $\forall M_{ri} \in A_r$, when $M_{ri}$ includes at least one FBL, for statistically obtaining the FBL count, $n^{FBL}$ may be adopted to represent the FBL count. $n^{FBL}$ may be assigned with an initial value 0, and when $M_{ri}$ includes an FB, a plus one operation may be performed on $n^{FBL}$ to determine the number of a BL including the FB. $n^{FBL}$ may represent the number of the FBL that is presently operated, and $y_l^{FBL}$ may represent a number value of each FBL in the feature map.

Referring to FIG. 6, for the target repair bank subjected to second repair processing, the FBL numbers, i.e., the numbers of the FBLs, corresponding to each basic repair bank are 1; 1 and 2; 0; and 1, 2, 3, and 4 respectively. The FB feature map 620 of the target repair bank subjected to second repair processing is obtained. In S309, the MCN of the FB feature map may be determined according to the FBL number. The MCN may be recorded as $n_{ri}$. For $\forall M_{ri} \in A_r$, the MCN recorded as $n_{ri}$ may be equal to a maximum FBL number plus one, namely $n_{r1}=2$, $n_{r2}=3$, $n_{r3}=\text{NULL}$, and $n_{r4}=5$. In S310, after each MCN is determined, the bank repair cost may be determined according to the MCN, and the subsequent candidate repair combination determination operation may be executed.

According to some exemplary embodiments of the disclosure, a maximum FBL number of each of the basic repair banks subjected to second repair processing is determined according to the MCN. A segmented feature map group of each of the basic repair banks subjected to second repair processing is determined. Responsive to that the target repair bank meets a first calculation condition, the bank repair cost of the target repair bank is calculated based on the segmented feature map group subjected to second repair processing. The first calculation condition includes that the maximum FBL number of any of the basic repair banks is less than or equal to a target calculated value. Responsive to that the target repair bank does not meet the first calculation condition, the chip to be repaired is determined as a fail chip. The maximum FBL number may be a maximum number corresponding to the FB in a basic repair bank, and the maximum FBL number is recorded as $\hat{n}_{ri}$, where $\hat{n}_{ri} = \hat{n}_{ri} - 1$. The segmented feature map group may be a new feature map group generated after segmentation processing is performed on the FB feature map. The segmented feature map may be a feature map in the segmented feature map group, and a segmented feature map group may include one or more segmented feature maps. The first calculation condition may be a calculation condition adopted when the bank to be repaired may be repaired using the RBL. The target calculated value may be a calculated value compared with the maximum FBL number in any basic repair bank. The fail chip may be a chip that cannot be repaired using an existing redundant circuit.

Before the bank repair cost is calculated, segmentation processing is performed on the bank feature map subjected to second repair processing to generate the segmented feature map group. A new segmented feature map group may be generated by feature maps that are associated, unassociated, or spuriously associated, so that the associated feature maps may be processed as an independent feature map group, which may greatly reduce the complexity in operation. In addition, if a feature map group includes fewer feature maps, the calculation cost needed by acquiring FB positions during optimal must repair processing and optimal repair processing may be lower.

After the maximum FBL number in each basic repair bank is determined according to the MCN, whether the target repair bank meets the first calculation condition is determined. If the MCN of each basic repair bank in the target repair bank meets the first calculation condition, the candidate repair cost of the target repair bank is calculated. Specifically, the first calculation condition is shown as formula 1. In S311, whether the candidate repair cost of the target repair bank is equal to positive infinity is determined. If the candidate repair cost of the target repair bank is equal to positive infinity, the chip to be repaired is determined as a fail chip. Otherwise, S312 is continued to be executed to determine whether the target repair bank is the last bank. If YES, S313 is executed to sequence the calculated bank repair costs. If NO, the next target repair bank is continued to be acquired, and a bank repair cost is substantially estimated. The bank repair cost may be calculated using formula 1.

$$c_r^- = \begin{cases} \sum_{G_{rk} \in A_r} \prod_{M_{ri} \in G_k} \left[ \sum_{z=0}^{N_{ri}^{RBL}} \frac{\hat{n_{ri}}!}{z!(\hat{n_{ri}}!-z)!} \right], & \text{if } \forall \hat{n}_{ri} \le b_1 N_{RWL}^{(r)} + b_2; \\ \infty, & \text{otherwise} \end{cases} \quad \text{(Formula 1)}$$

$b_1$ may represent $N_{ij}^{FWL} \in \forall M_{ri}$, i.e., the maximum count of FBs repaired using each RWL in $M_{ri}$. $b_2$ may represent the count of RBLs that may be allocated in the bit feature map of the present basic repair bank. $c_r^-$ may represent the candidate combination count of the target repair bank. The first calculation condition may be $\forall \hat{n}_{ri} \le b_1 N_{RWL}^{(r)} + b_2$.

Figure 15:
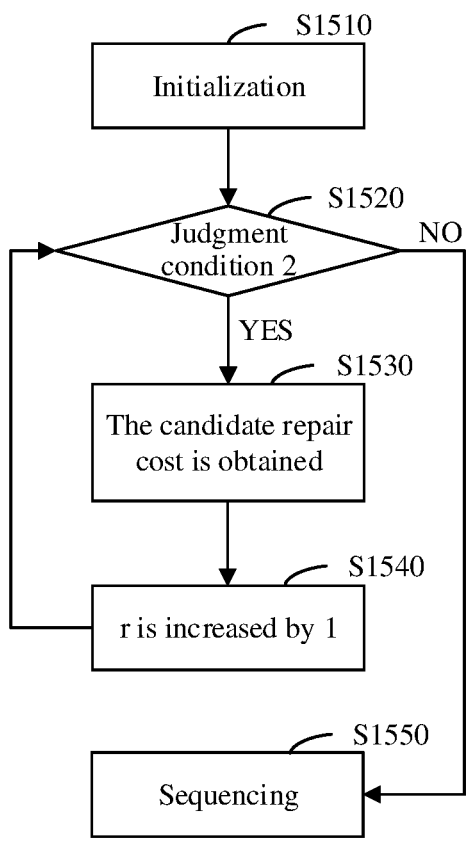
FIG. 15 schematically shows a flowchart of calculating a bank repair cost of each target repair bank according to an exemplary implementation of the disclosure.

References are made to FIG. 15. FIG. 15 schematically shows a flowchart of calculating a bank repair cost of each target repair bank according to an exemplary implementation of the disclosure. In S1510, an initialization operation may be performed at first to initialize r=0 and $c_r^-=0$. After initialization is completed, S1520 is executed, namely judgment condition 2 is determined, judgment condition 2 is $A_r \in U$ and $c_r^- \ne \infty$. If judgment condition 2 is met, S1530 is executed to roughly estimate the bank repair cost corresponding to the target repair bank, namely the candidate repair cost is obtained. In S1540, the target repair banks are acquired one by one, and the operation in S1520 is executed on each target repair bank. If judgment condition 2 is not met, S1550 is executed to sequence the calculated bank repair costs.

The bank repair cost of each target repair bank is calculated to directly and roughly determine that the chip to be repaired really cannot be repaired, so that highly complex combination inferences that are often needed when chips really cannot be repaired may be effectively avoided. In addition, all the target repair banks are sequenced for operation from low to high costs, and rapid operations corresponding to low costs and reduction of the count of available RWLs due to probable use of RWLs are favorable for directly determining a result that there is no solution when the chip to be repaired really cannot be repaired and greatly eliminate the high-cost operations for the target repair banks.

According to some exemplary embodiments of the disclosure, responsive to that the target repair bank meets the first calculation condition, the following operations are executed on the segmented feature map group in the target repair bank. For each of the target repair banks, a vector length of a repair vector of the respective target repair bank is determined according to the MCN in the segmented feature map group, and the repair vector of the respective target repair bank is initialized. The repair vector is updated using a hybrid carry system according to an FBL number combination. For each of the target repair banks, candidate repair sub solutions for the respective target repair bank is determined according to the updated repair vector, and for each of the candidate repair sub solutions, a candidate repair sub cost corresponding to the candidate repair sub solution is calculated. The candidate repair combinations are determined according to the candidate repair sub solutions, and the candidate repair costs are determined according to the candidate repair sub costs. The repair vector may be a vector reflecting all the possible repair combinations corresponding to repair of the FBs in the target repair bank using the redundant circuit. The vector length may be an element count of the repair vector, and the vector length may be determined according to the MCN.

The hybrid carry system may be a carry system adopted when repair solutions corresponding to different $M_{ri}$ in the target repair bank are determined. For example, a target repair bank may include four $M_{ri}$, i.e. $M_{r1}$, $M_{r2}$, $M_{r3}$, and $M_{r4}$. In such case, $M_{r1}$ of a first map adopts an $n_{r1}$-carry system, $M_{r2}$ of a second map adopts an $n_{r2}$-carry system, and so on. For example, in FIG. 6, $M_{r1}$ is binary, $M_{r2}$ is ternary, and $M_{r4}$ is quinary. The candidate repair combination may be a repair combination formed by integrating the bank repair solutions for each target repair bank when the target repair regions in the chip to be repaired are repaired using the redundant circuit. In sequence positions that each map belongs to, except 0s, if a left number is greater than or equal to a right number, the right number is equal to the left number plus 1 to ensure that the left number is less than the right number, and carry judgment is performed on the FBL number. For each of the target repair banks, the candidate repair sub solutions may be all the possible repair solutions corresponding to the target repair bank. The candidate repair sub cost may be a cost corresponding to the candidate repair sub solution. The candidate repair solutions may be all repair solutions for repairing the chip to be repaired using the redundant circuit. The candidate repair cost may be a cost corresponding to repair processing of the chip to be repaired using the candidate repair solution.

Referring to FIG. 3, in S314, whether the target repair bank meets the first calculation condition may be determined. In S315, if the target repair bank meets the first calculation condition, an optimal combination detection operation is executed on the target repair bank to determine all the candidate repair sub solutions for the target repair bank. A specific process is as follows: the vector length of the repair vector of each segmented feature map group is determined according to the MCN in the segmented feature map group. The vector length may be equal to the MCN. References are made to FIG. 6, In FIG. 6, the MCNs in the segmented feature map groups subjected to second repair processing are $n_{r1}=2$, $n_{r2}3$, $n_{r3}=$NULL, and $n_{r4}=5$ respectively. In such case, vector lengths of repair vectors of each segmented feature map group are 2, 3, and 5 respectively.

In the disclosure, the target repair banks of the chip to be repaired are processed one by one, so variable r may be defined to traverse all the target repair banks in the chip to be repaired. In addition, variable $h_1$ may be defined, $h_1$ being a Boolean variable, to represent whether the chip to be repaired may be repaired successfully. It is initially assumed that the chip to be repaired may be repaired successfully ($h_1$=TRUE), and a value obtained by operation is a judgment about whether the chip may be finally repaired successfully. When the candidate repair combinations are determined, r=0 and $h_1$=TRUE may be initialized, and the following operations are executed.

When $A_r \in U$ and $h_1$=TRUE, the candidate repair sub cost $c_{\tilde{r}}$ corresponding to each target repair bank may be calculated. Whether the candidate repair sub cost is equal to positive infinity is determined. When $c_{\tilde{r}} \neq \infty$, the following operations are executed on feature map groups including at least one FBL, namely $\forall G_{rk} \in \overline{A}_r$, one by one. Operation 1, the repair vector s is initialized, the repair vector s including $N_{rk}^{seq}$ 0s, $$N_{rk}^{seq} = \sum_{v=0}^{\hat{v}} N_{rkv}^{RBL},$$

variable $s_0$ is defined, and $s_0$=0 is initialized. Operation 2, $s_0$ is successively increased by 1, and a value of the repair vector s is determined using the hybrid carry system and an FBL number combination rule to determine the candidate repair sub solution. Operation 3, a repair cost corresponding to the repair vector s is calculated. Operations 2 and 3 are repeated until $s_{\hat{v}}=N_{rk\hat{v}}^{RBL}$.

Figure 16:
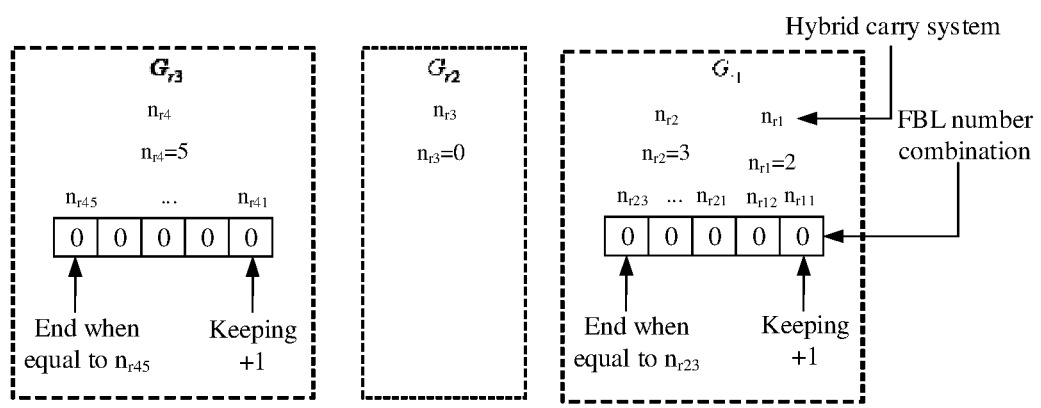
FIG. 16 schematically shows a diagram of determining candidate repair combinations using a hybrid carry system and a Fail Bit Line (FBL) number combination according to an exemplary implementation of the disclosure.

References are made to FIG. 16. FIG. 16 schematically shows a diagram of determining a candidate repair combinations using a hybrid carry system and an FBL number combination according to an exemplary implementation of the disclosure. Carry-based numbering processing shown in FIG. 16 may be performed according to a vector s to obtain all possible combinations of the vector s.

According to some exemplary embodiments of the disclosure, a present left RWL count and a used RWL count in each target repair bank are determined. Responsive to that the present left RWL count is greater than the used RWL count, the candidate repair sub solution is determined according to an RBL count, a used RBL, and the used RWL count in the target repair bank, and the candidate repair sub cost corresponding to each candidate repair sub solution is determined. The RBL count of the target repair bank may be the count of all the RBLs in each target repair bank. The present left RWL count may be the number of present available RWLs when repair processing is performed on the bank to be repaired. The RBL count may be the total count of RBLs in each target repair bank, and may be represented by $b_3$, $$b_3 = \sum_i N_{ri}^{RBL}.$$

The used RBL count may be the count of RBLs that have been used at present in the target repair bank, and may be represented by $n_{RBL}^{(t)}$. The used RWL count may be the count of RWLs that have been used at present in the target repair bank, and may be represented by $n_{RWL}^{(t)}$.

Figure 17:
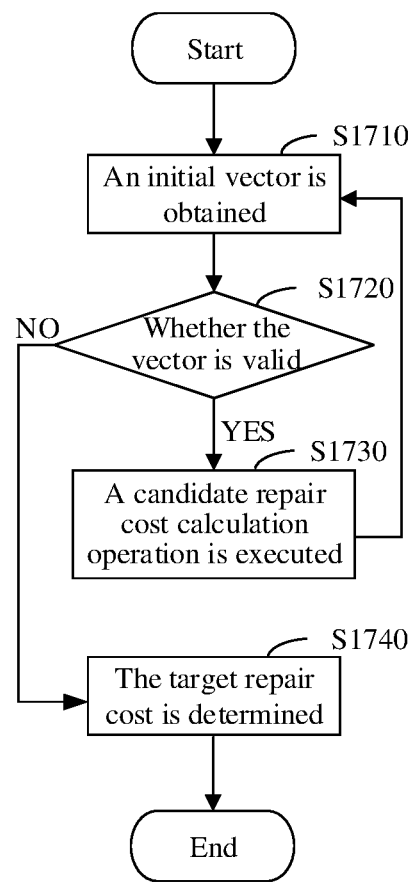
FIG. 17 schematically shows a flowchart of determining candidate repair combinations according to an exemplary implementation of the disclosure.

References are made to FIG. 17. FIG. 17 schematically shows a flowchart of determining candidate repair combinations according to an exemplary implementation of the disclosure. In S1710, the initialized vector s may be acquired at first. In S1720, whether the vector s is valid is determined. If the vector s is valid, S1730 is executed, namely a candidate repair cost calculation operation is executed. If the vector s is invalid, S1740 is executed to determine a target repair cost, namely to determine a minimum candidate repair sub cost. Specifically, the candidate repair sub cost corresponding to the candidate repair sub solution may be calculated through formula 2:

$$f^c(s, N_{RWL}^{(t)}) = \begin{cases} b_3 n_{RWL}^{(t)} + n_{RBL}^{(t)}, & \text{if } N_{RWL}^{(t)} - n_{RWL}^{(t)} \geq 0; \\ \infty, & \text{otherwise} \end{cases} \quad \text{(Formula 2)}$$

$b_3$ may be $$\sum_i N_{ri}^{RBL},$$

i.e., the number of total RBLs of each target repair bank. $n_{RBL}^{(t)}$ may be the count of used RBLs of the target repair bank, namely $$\sum_{q=0}^{v} \{1 \mid s_q > 0, s_q \in s\}.$$

In S150, a target repair cost is determined according to the candidate repair costs, and a target repair solution corresponding to the target repair cost is determined to perform repair processing on the unrepaired FBs according to the target repair solution.

In some exemplary embodiments of the disclosure, the target repair cost may be a repair cost with a minimum numerical value, which is determined from all the candidate repair costs. The target repair solution may be the repair solution corresponding to the target repair cost. An integrated repair cost may be a repair cost obtained by integrating the candidate repair costs, each corresponding to a respective candidate repair sub solution. Each candidate repair sub solution may be integrated to obtain the target repair solution. The target repair solution corresponds to a minimum integrated repair cost, namely corresponds to the target repair cost. Before the target repair solution for the bank to be repaired is determined, the candidate repair sub solution corresponding to each target repair bank may be determined at first, the candidate repair sub cost corresponding to each candidate repair sub solution is determined, an add operation may be performed on the minimum candidate repair sub costs, each corresponding to the respective target repair bank, to obtain the target repair cost, and the target repair solution corresponding to the target repair cost is determined to perform repair processing on the chip to be repaired according to the target repair solution. Specifically, referring to FIG. 3, in S316, judgment condition 2 may be determined, judgment condition 2 is $c_r^{MIN} < \infty$. If judgment condition 2 is true, the target repair cost determination operation is continued. Otherwise, the chip to be repaired is determined as a fail chip.

According to some exemplary embodiments of the disclosure, for each of the target repair banks, the minimum candidate repair sub cost is determined from the candidate repair sub costs corresponding to the respective target repair bank, to obtain a plurality of minimum candidate repair sub costs. The add operation is performed on the minimum candidate repair sub costs to obtain the target repair cost.

After the bank to be repaired is divided into the plurality of target repair banks, the candidate repair sub solutions corresponding to each target repair solution may be determined using the hybrid carry system according to the FBL number combination, the candidate repair sub solutions for all the target repair banks and the candidate repair sub costs corresponding to each candidate repair sub solution may be integrated to obtain the target repair cost and the target repair solution corresponding thereto according to the candidate repair sub cost of each target repair bank, otherwise the chip to be repaired is determined as a fail chip. Referring to FIG. 3, in S317, whether the presently calculated target repair bank is the last bank may be determined. In S318, if the presently calculated target repair bank is the last bank, the target repair cost is determined, and the target repair solution is stored. The target repair cost is formed by the minimum candidate repair sub costs, each corresponding to a respective one of the target repair banks. Otherwise, the next target repair bank is continued to be selected for judgment. If judgment condition 2 is false, the chip to be repaired is determined as a fail chip.

The target repair cost is determined through the following specific process. After one or more candidate repair sub costs corresponding to the candidate repair sub solution are calculated through formula 2, the minimum candidate repair sub cost may be calculated according to formula 3 to perform add processing on the minimum candidate repair sub costs, each corresponding to a respective one of the target repair banks, to obtain the target repair cost. The target repair solution corresponding to the target repair cost is determined, and repair processing is performed on the chip to be repaired using the target repair solution.

$$c_r^{MIN} = \arg\min f^c(s, N_{RWL}^{(t)}) \quad \text{(Formula 3).}$$

$$N_{RWL}^{(t+1)} = N_{RWL}^{(t)} - n_{RWL}^{(t)}.$$

Through the above processing operations, the condition that there is really no allocation solution may be found in advance, and operations are directly ended, so that unnecessary optimal must repair operations may be eliminated, and the operation cost may be reduced greatly.

According to the method for FB repairing in the exemplary embodiment of the disclosure, on one aspect, the FBs may be repaired by first repair processing and second repair processing at first to ensure that FR is implemented on most FBs before all the repair combinations are searched to greatly reduce the count of the candidate repair combinations, so that the operation cost in determination of the candidate combinations may be reduced greatly. On another aspect, the candidate repair combinations and the candidate repair costs may be determined using the optimal combined detection manner to screen the condition of no allocation solution in advance and end the operations, so that unnecessary operations may be eliminated greatly, and the operation cost may be reduced. On a third aspect, the feature map group is segmented according to the association relationship, and the candidate repair combinations are determined according to the feature map group obtained by segmentation processing, so that the complexity in operation may be reduced greatly. On a fourth aspect, repair processing is performed on the unrepaired FBs using the target repair solution, so that the FBs may be repaired with the minimum repair cost, and a purpose of optimally and rapidly allocating the redundant circuit to repair the FBs may be achieved.

Figure 18:
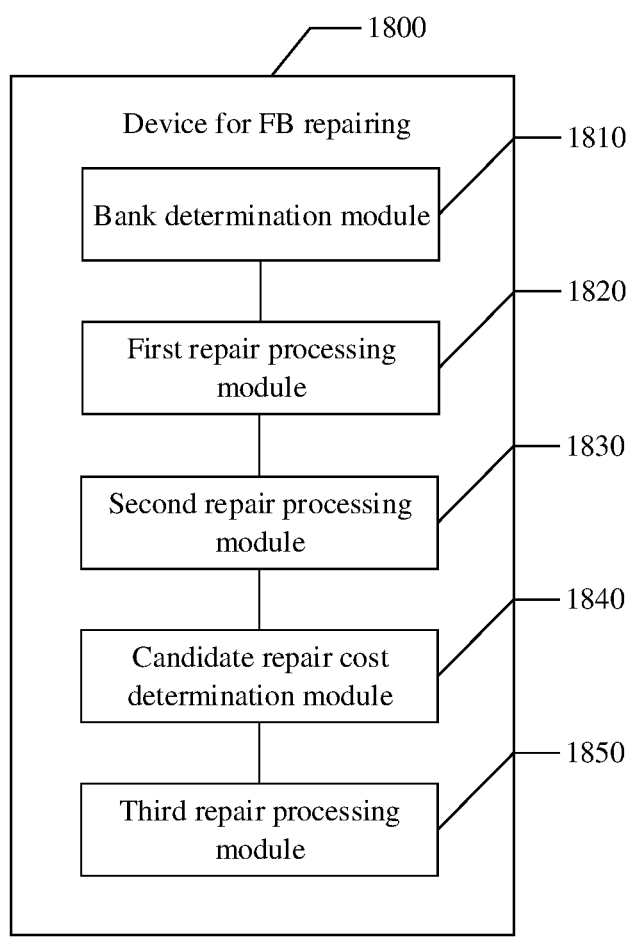
FIG. 18 schematically shows a block diagram of a device for FB repairing according to an exemplary implementation of the disclosure.

In addition, there is also provided in an exemplary embodiment a device for FB repairing. Referring to FIG. 18, the device 1800 for FB repairing may include a bank determination module 1810, a first repair processing module 1820, a second repair processing module 1830, a candidate repair cost determination module 1840, and a third repair processing module 1850.

Specifically, the disclosure bank determination module 1810 is configured to determine a bank to be repaired of a chip to be repaired, the bank to be repaired includes a plurality of target repair banks. The first repair processing module 1820 is configured to perform first repair processing on first FBs in each target repair bank using a redundant circuit. The second repair processing module 1830 is configured to, after performing the first repair processing, determine second FBs, and perform second repair processing on the second FBs through a state judgment repair operation, the second FBs are FBs that meet a specific condition. The candidate repair cost determination module 1840 is configured to, for each target repair bank, determine unrepaired FBs in the target repair bank, and determine, using an optimal combined detection manner, candidate repair combinations for the unrepaired FBs, candidate repair costs, each corresponding to a respective one of the candidate repair combinations. The third repair processing module 1850 is configured to determine a target repair cost according to the candidate repair costs, and determine a target repair solution corresponding to the target repair cost to perform repair processing on the unrepaired FBs according to the target repair solution.

The device 1800 for FB repairing may repair the FBs by first repair processing and second repair processing at first to ensure that FR is implemented on most FBs before all repair combinations are searched to greatly reduce the count of the candidate repair combinations, so that the operation cost in determination of the candidate combinations may be reduced greatly. The candidate repair combinations and the candidate repair costs may be determined using the optimal combined detection manner to screen the condition of no allocation solution in advance and end the operations, so that unnecessary operations may be eliminated greatly, and the operation cost may be reduced. In addition, repair processing is performed on the unrepaired FBs using the target repair solution, so that the FBs may be repaired with the minimum repair cost, and a purpose of optimally and rapidly allocating the redundant circuit to repair the FBs may be achieved.

In an exemplary implementation of the disclosure, the device for FB repairing further includes a bank compression module, configured to: determine an initial bank to be repaired of the chip to be repaired, herein the initial bank to be repaired includes initial WLs and initial BLs; acquire a WL compression ratio and BL compression ratio of the initial bank to be repaired; and perform compression on the initial WLs according to the WL compression ratio, and perform compression on the initial BLs according to the BL compression ratio, to form the bank to be repaired.

In an exemplary implementation of the disclosure, the FB repair device further includes a bank division module, configured to determine a division column for the bank to be repaired, herein a width of the division column is determined according to a row-direction equivalent bit count in a compressed DQ, and perform column division on the bank to be repaired according to the division column to form the plurality of target repair banks.

In an exemplary implementation of the disclosure, the first repair processing module includes a first repair processing unit, configured to determine an FB feature map of the target repair bank, and perform, according to the FB feature map, the first repair processing on FBs in the target repair bank using the redundant circuit.

In an exemplary implementation of the disclosure, the first repair processing unit includes a feature map determination subunit, configured to: divide the target repair bank into a plurality of basic repair banks, herein the basic repair bank includes a preset count of DQs; acquire the basic repair banks, and for each of the basic repair banks, determine bit states of all bits in the basic repair bank; for each of the preset count of DQs, perform OR operation on the bit states of the bits in a respective one of the DQ, and combine results of the OR operations for the preset count of DQs to generate an FB map of the basic repair bank; and generate the FB feature map according to the generated FB maps, each corresponding to a respective one of the basic repair banks.

In an exemplary implementation of the disclosure, the first repair processing unit includes a first repair processing subunit, configured to perform a determination operation, including: determining whether the FB feature map meets a preset condition, herein the preset condition includes a first preset condition and a second preset condition; perform a first initial repair processing operation, including: responsive to that the FB feature map meets the first preset condition, performing repair processing on the FBs using the RWLs, herein the first preset condition includes that an FB count of a first number WL in the basic repair bank is larger than a present left RBL count in the basic repair bank; and perform a second initial repair processing operation, including: responsive to that the FB feature map meets the second preset condition, performing repair processing on the FBs using the RBLs, herein the second preset condition includes that an FB count of a first number BL in the basic repair bank is larger than a present left RWL count in the basic repair bank.

In an exemplary implementation of the disclosure, the FB repair device further includes an initial condition judgment module, configured to: acquire an FB feature map of the target repair bank, and determining a target FB count, an available RBL count, and a present left RWL count in the target repair bank; responsive to that the target repair bank meets an initial judgment condition, end repair processing, herein the initial judgment condition includes that the target FB count is equal to 0, or the available RBL count is equal to 0, or the present left RWL count is less than 0; responsive to that the target repair bank does not meet the initial judgment condition, perform segmentation processing on the FB feature map according to an association relationship to generate a segmented feature map group, herein the segmented feature map group includes segmented feature maps; and responsive to that a bank feature map state of the target repair bank is a second initial state and a new FB feature map is generated in the segmented feature map group, adjust the second initial state to a first initial state.

In an exemplary implementation of the disclosure, the second repair processing module includes a second repair processing unit, configured to: acquire a state judgment set, and selecting a target judgment state corresponding to the bank feature map state from the state judgment set; determine bit positions of the second FBs in each target repair bank according to the target judgment state; and perform the second repair processing on the second FBs according to the bit positions of the second FBs.

In an exemplary implementation of the disclosure, the device for FB repairing further includes a repair priority determination module, configured to determine a repair priority of the unrepaired FB, and repair the FB according to the repair priority. The repair priority includes: a first repair priority, which meets a condition: a new segmented feature map group is generated after performing segmentation processing on a segmented feature map, and an RWL count in the segmented feature map after FB repair processing is greater than a first preset numerical value; a second repair priority which meets a condition: after performing repair processing on FBLs, the segmented feature map is segmented, and a new segmented feature map group is generated; a third repair priority, which meets a condition: after performing repair processing on the FBLs in a basic repair bank, the RWL count corresponding to the basic repair bank is equal to 0; a fourth repair priority, which meets a condition: an FBL corresponding to a maximum number value in a first BL maximum FB, or an FBL corresponding to a maximum number value in a second BL maximum FB; a fifth repair priority, which meets a condition: a target Fail Word Line (FWL), herein the target FWL is a maximum FWL corresponding to a larger number value in two maximum FWLs including FBL; a sixth repair priority, which meets a condition: an FB corresponding to a maximum number value in an FBL; a seventh repair priority, which meets a condition: an RBL configured to repair the FBLs and corresponding to a minimum number value in the segmented feature map; and an eighth repair priority, which meets a condition: a first one of the FBs that is randomly determined.

In an exemplary implementation of the disclosure, the FB repair device further includes a bank cost determination module, configured to execute the following operations on each of the target repair banks: acquiring an FB feature map of the target repair bank subjected to the second repair processing; numbering FBLs according to the FB feature map to generate FBL numbers; generating an MCN of the FB feature map according to the FBL numbers; and calculating a bank repair cost of the target repair bank according to the MCN.

In an exemplary implementation of the disclosure, the bank cost determination module includes a bank cost determination unit, configured to: determine, according to the MCN, a maximum FBL number of each of the basic repair banks subjected to the second repair processing; determine a segmented feature map group of each of the basic repair banks subjected to the second repair processing; responsive to that the target repair bank meets a first calculation condition, calculate, based on the segmented feature map group subjected to the second repair processing, the bank repair cost of the target repair bank, herein the first calculation condition includes that the maximum FBL number of any of the basic repair banks is less than or equal to a target calculated value; and responsive to that the target repair bank does not meet the first calculation condition, determine the chip to be repaired as a fail chip.

In an exemplary implementation of the disclosure, the candidate repair cost determination module includes a candidate repair cost determination unit, configured to, responsive to that the target repair bank meets the first calculation condition, execute the following operations on the target repair bank: for each of the target repair banks, determining a vector length of a repair vector of the respective target repair bank according to the MCN in the segmented feature map group, and initializing the repair vector of the respective target repair bank; updating, according to an FBL number combination, the repair vector using a hybrid carry system; for each of the target repair banks, determining candidate repair sub solutions for the respective target repair bank according to the updated repair vector, and for each of the candidate repair sub solutions, calculating a candidate repair sub cost corresponding to the candidate repair sub solution; and determining the candidate repair combinations according to the candidate repair sub solutions, and determining the candidate repair costs according to the candidate repair sub costs.

In an exemplary implementation of the disclosure, the candidate repair cost determination unit includes a cost determination subunit, configured to determine a present left RWL count and a used RWL count in the target repair bank, and responsive to that the present left RWL count is greater than the used RWL count, for each of the candidate repair sub solutions, determine the candidate repair sub cost corresponding to the candidate repair sub solution according to an RBL count, a used RBL count, and the used RWL count in the target repair bank.

In an exemplary implementation of the disclosure, the third repair processing module includes a target cost determination module, configured to for each of the target repair banks, determine a minimum candidate repair sub cost from the candidate repair sub costs corresponding to the respective target repair bank, to obtain a plurality of minimum candidate repair sub costs, and an add operation on the minimum candidate repair sub costs to obtain the target repair cost.

Specific details about each virtual module of the device for FB repairing have been described in detail in the corresponding method for FB repairing, and thus elaborations are omitted herein.

It is to be noted that, although a plurality of modules or units of the device for FB repairing are mentioned in the above detailed descriptions, such division is not mandatory. In practice, features and functions of two or more modules described above may be embodied in one module or unit according to the implementations of the disclosure. Conversely, the feature and function of one module or unit described above may further be divided into a plurality of modules or units for embodiment.

In addition, the drawings are only schematic descriptions about processing in the method according to the exemplary embodiments of the disclosure and not for a purpose of limitation. It is easily understood that processing shown in the drawings does not indicate or limit the time sequence of the processing. In addition, it is also easily understood that such processing may be executed, for example, in a plurality of modules at the same time or at different time.

Other embodiments of the disclosure are apparent to those skilled in the art after considering the specification and practicing the disclosure disclosed here. The application is intended to cover any transformations, uses or adaptive variations of the disclosure, and these transformations, uses or adaptive variations follow the general principle of the disclosure, and include common general knowledge or conventional technical means undisclosed in the disclosure in the technical field. The specification and the embodiments are only considered as examples, and the practical scope and spirit of the disclosure are pointed out by the claims.

It should be understood that the disclosure is not limited to the precise structures described above and shown in the drawings, and various modifications and variations may be made without departing from the scope thereof. The scope of the disclosure is only defined by the appended claims.

The invention claimed is:

1. A method for Fail Bit (FB) repairing, comprising:
determining a bank to be repaired of a chip to be repaired;
determining a division column for the bank to be repaired, wherein a width of the division column is determined according to a row-direction equivalent bit count in a compressed Data Queue (DQ);
performing column division on the bank to be repaired according to the division column to form a plurality of target repair banks;
performing first repair processing on first FBs in each target repair bank using a redundant circuit;
after performing the first repair processing, determining second FBs, and performing second repair processing on the second FBs through a state judgment repair operation, wherein the second FBs are FBs that meet a specific condition;
for each target repair bank,
determining unrepaired FBs in the target repair bank, and determining, using an optimal combined detection manner, candidate repair combinations for the unrepaired FBs, candidate repair costs, each corresponding to a respective one of the candidate repair combinations; and
determining a target repair cost according to the candidate repair costs, and determining a target repair solution corresponding to the target repair cost to perform repair processing on the unrepaired FBs according to the target repair solution.

2. The method of claim 1, before determining the bank to be repaired of the chip to be repaired, further comprising:
determining an initial bank to be repaired of the chip to be repaired, wherein the initial bank to be repaired comprises initial Word Lines (WLs) and initial Bit Lines (BLs);
acquiring a WL compression ratio and BL compression ratio of the initial bank to be repaired; and
performing compression on the initial WLs according to the WL compression ratio, and performing compression on the initial BLs according to the BL compression ratio, to form the bank to be repaired.

3. The method of claim 1, wherein the performing the first repair processing on the first FBs in each target repair bank using the redundant circuit comprises:
determining an FB feature map of the target repair bank; and
performing, according to the FB feature map, the first repair processing on FBs in the target repair bank using the redundant circuit.

4. The method of claim 3, wherein the determining the FB feature map of the target repair bank comprises:
dividing the target repair bank into a plurality of basic repair banks, wherein the basic repair banks comprise a preset count of DQs;
acquiring the basic repair banks;
for each of the basic repair banks,
determining bit states of all bits in the basic repair bank; and
for each of the preset count of DQs, performing OR operation on the bit states of the bits in a respective one of the DQs, and combining results of the OR operations for the preset count of DQs to generate an FB map of the basic repair bank; and
generating the FB feature map according to the generated FB maps, each corresponding to a respective one of the basic repair banks.

5. The method of claim 3, wherein the redundant circuit comprises Redundant Word-Lines (RWLs) and Redundant Bit-Line (RBLs), and the performing, according to the FB feature map, the first repair processing on the FBs in the target repair bank using the redundant circuit comprises:
a determination operation, comprising: determining whether the FB feature map meets a preset condition, wherein the preset condition comprises a first preset condition and a second preset condition;
a first initial repair processing operation, comprising: responsive to the FB feature map meeting the first preset condition, performing repair processing on the FBs using the RWLs, wherein the first preset condition comprises that an FB count of a first number Word Line (WL) in a basic repair bank is larger than a present left RBL count in the basic repair bank; and
a second initial repair processing operation, comprising: responsive to the FB feature map meeting the second preset condition, performing repair processing on the FBs using the RBLs, wherein the second preset condition comprises that an FB count of a first number Bit Line (BL) in the basic repair bank is larger than a present left RWL count in the basic repair bank.

6. The method of claim 1, before determining the second FBs, further comprising:
acquiring an FB feature map of the target repair bank, and determining a target FB count, an available Redundant Bit-Line (RBL) count, and a present left Redundant Word-Lines (RWL) count in the target repair bank;
responsive to that-the target repair bank meeting an initial judgment condition, ending repair processing, wherein the initial judgment condition comprises that the target FB count is equal to 0, or the available RBL count is equal to 0, or the present left RWL count is less than 0;
responsive to the target repair bank not meeting the initial judgment condition, performing segmentation processing on the FB feature map according to an association relationship to generate a segmented feature map group, wherein the segmented feature map group comprises segmented feature maps; and
responsive to a bank feature map state of the target repair bank being a second initial state and a new FB feature map being generated in the segmented feature map group, adjusting the second initial state to a first initial state.

7. The method of claim 6, wherein performing the second repair processing on the second FBs through the state judgment repair operation comprises:
acquiring a state judgment set, and selecting a target judgment state corresponding to the bank feature map state from the state judgment set;
determining bit positions of the second FBs in each target repair bank according to the target judgment state; and
performing the second repair processing on the second FBs according to the bit positions of the second FBs.

8. The method of claim 1, further comprising:
determining a repair priority for repairing the FBs, and repairing the FBs according to the repair priority,
wherein the repair priority comprises:
   a first repair priority, which meets a condition: a new segmented feature map group is generated after performing segmentation processing on a segmented feature map, and a Redundant Word-Lines (RWL) count in the segmented feature map after FB repair processing is greater than a first preset numerical value;
   a second repair priority, which meets a condition: after performing repair processing on Fail Bit Lines (FBLs), the segmented feature map is segmented, and a new segmented feature map group is generated;
   a third repair priority, which meets a condition: after performing repair processing on the FBLs in a basic repair bank, the RWL count corresponding to the basic repair bank is equal to 0;
   a fourth repair priority, which meets a condition: an FBL corresponding to a maximum number value in a first Bit Line (BL) maximum FB, or an FBL corresponding to a maximum number value in a second BL maximum FB;
   a fifth repair priority, which meets a condition: a target Fail Word Line (FWL), wherein the target FWL is a maximum FWL corresponding to a larger number value in two maximum FWLs, and each of the two maximum FWLs comprises at least one FBL;
   a sixth repair priority, which meets a condition: an FB corresponding to a maximum number value in an FBL;
   a seventh repair priority, which meets a condition: a Redundant Bit-Line (RBL) configured to repair the FBLs and corresponding to a minimum number value in the segmented feature map; and
   an eighth repair priority, which meets a condition: a first one of the FBs that is randomly determined.

9. The method of claim 1, before the determining, using the optimal combined detection manner, the candidate repair combinations for the unrepaired FBs, the candidate repair costs, each corresponding to the respective one of the candidate repair combinations, further comprising:
   executing the following operations on each of the target repair banks:
      acquiring an FB feature map of the target repair bank subjected to the second repair processing;
      numbering Fail Bit Lines (FBLs) according to the FB feature map to generate FBL numbers;
      generating a Map Combination Number (MCN) of the FB feature map according to the FBL numbers; and
      calculating a bank repair cost of the target repair bank according to the MCN.

10. The method of claim 9, wherein the calculating the bank repair cost of the target repair bank according to the MCN comprises:
   determining, according to the MCN, a maximum FBL number of each of basic repair banks subjected to the second repair processing;
   determining a segmented feature map group of each of the basic repair banks subjected to the second repair processing;
   responsive to the target repair bank meeting a first calculation condition, calculating, based on the segmented feature map group subjected to the second repair processing, the bank repair cost of the target repair bank,
   wherein the first calculation condition comprises that the maximum FBL number of any of the basic repair banks is less than or equal to a target calculated value; and
   responsive to the target repair bank not meeting the first calculation condition, determining the chip to be repaired as a fail chip.

11. The method of claim 10, wherein the determining, using the optimal combined detection manner, the candidate repair combinations for the unrepaired FBs, the candidate repair costs, each corresponding to the respective one of the candidate repair combinations comprises:
   responsive to the target repair bank meeting the first calculation condition, executing the following operations on the target repair bank:
      for each of the target repair banks, determining a vector length of a repair vector of the respective target repair bank according to the MCN in the segmented feature map group, and initializing the repair vector of the respective target repair bank;
      updating, according to an FBL number combination, the repair vector using a hybrid carry system to yield an updated repair vector;
      for each of the target repair banks, determining candidate repair sub solutions for the respective target repair bank according to the updated repair vector, and for each of the candidate repair sub solutions, calculating a candidate repair sub cost corresponding to the candidate repair sub solution; and
      determining the candidate repair combinations according to the candidate repair sub solutions, and determining the candidate repair costs according to the candidate repair sub costs.

12. The method of claim 11, wherein for each of the candidate repair sub solutions, calculating the candidate repair sub cost corresponding to the candidate repair sub solution comprises:
   determining a present left Redundant Word-Lines (RWL) count and a used RWL count in the target repair bank; and
   responsive to the present left RWL count being greater than the used RWL count, for each of the candidate repair sub solutions, determining the candidate repair sub cost corresponding to the candidate repair sub solution according to a Redundant Bit-Line (RBL) count, a used RBL count, and the used RWL count in the target repair bank.

13. The method of claim 1, wherein the candidate repair cost comprises a plurality of candidate repair sub costs, each corresponding to a respective one of the target repair banks, and the determining the target repair cost according to the candidate repair costs comprises:
   for each of the target repair banks, determining a minimum candidate repair sub cost from the candidate repair sub costs corresponding to the respective target repair bank, to obtain a plurality of minimum candidate repair sub costs; and
   performing an add operation on the minimum candidate repair sub costs to obtain the target repair cost.

14. A device for Fail Bit (FB) repairing, comprising:
   a bank determination circuit, configured to determine a bank to be repaired of a chip to be repaired;
   a bank division circuit, configured to determine a division column for the bank to be repaired, wherein a width of the division column is determined according to a row-direction equivalent bit count in a compressed Data Queue (DQ); and perform column division on the bank to be repaired according to the division column to form a plurality of target repair banks;

a first repair processing circuit, configured to perform first repair processing on first FBs in each target repair bank using a redundant circuit;

a second repair processing circuit, configured to, after performing the first repair processing, determine second FBs, and perform second repair processing on the second FBs through a state judgment repair operation, wherein the second FBs are FBs that meet a specific condition;

a candidate repair cost determination circuit, configured to, for each target repair bank, determine unrepaired FBs in the target repair bank, and determine, using an optimal combined detection manner, candidate repair combinations for the unrepaired FBs, candidate repair costs, each corresponding to a respective one of the candidate repair combinations; and a third repair processing circuit, configured to determine a target repair cost according to the candidate repair costs, and determine a target repair solution corresponding to the target repair cost to perform repair processing on the unrepaired FBs according to the target repair solution.

15. The device of claim 14, further comprising:
a bank compression circuit, configured to:
  determine an initial bank to be repaired of the chip to be repaired, wherein the initial bank to be repaired comprises initial Word Lines (WLs) and initial Bit Lines (BLs);
  acquire a WL compression ratio and BL compression ratio of the initial bank to be repaired; and
  perform compression on the initial WLs according to the WL compression ratio, and perform compression on the initial BLs according to the BL compression ratio, to form the bank to be repaired.

16. The device of claim 14, wherein the first repair processing circuit comprises:
a first repair processing sub circuit, configured to:
  determine an FB feature map of the target repair bank; and
  perform, according to the FB feature map, the first repair processing on FBs in the target repair bank using the redundant circuit.

17. The device of claim 16, wherein the first repair processing circuit comprises:
a feature map determination sub circuit, configured to:
  divide the target repair bank into a plurality of basic repair banks, wherein the basic repair banks comprise a preset count of DQs;
  acquire the basic repair banks;
  for each of the basic repair banks,
    determine bit states of all bits in the basic repair bank; and
    for each of the preset count of DQs, perform OR operation on the bit states of the bits in a respective one of the DQs, and combine results of the OR operations for the preset count of DQs to generate an FB map of the basic repair bank; and
  generate the FB feature map according to the generated FB maps, each corresponding to a respective one of the basic repair banks.

18. The device of claim 16, wherein the redundant circuit comprises Redundant Word-Lines (RWLs) and Redundant Bit-Line (RBLs), and the first repair processing sub circuit is configured to perform the following operations:
  a determination operation, comprising: determining whether the FB feature map meets a preset condition, wherein the preset condition comprises a first preset condition and a second preset condition;
  a first initial repair processing operation, comprising: responsive to the FB feature map meeting the first preset condition, performing repair processing on the FBs using the RWLs, wherein the first preset condition comprises that an FB count of a first number Word Line (WL) in a basic repair bank is larger than a present left RBL count in the basic repair bank; and
  a second initial repair processing operation, comprising: responsive to the FB feature map meeting the second preset condition, performing repair processing on the FBs using the RBLs, wherein the second preset condition comprises that an FB count of a first number Bit Line (BL) in the basic repair bank is larger than a present left RWL count in the basic repair bank.

19. The device of claim 14, further comprising:
an initial condition judgment circuit, configured to:
  acquire an FB feature map of the target repair bank, and determine a target FB count, an available Redundant Bit-Line (RBL) count, and a present left Redundant Word-Line (RWL) count in the target repair bank;
  responsive to the target repair bank meeting an initial judgment condition, end repair processing, wherein the initial judgment condition comprises that the target FB count is equal to 0, or the available RBL count is equal to 0, or the present left RWL count is less than 0;
  responsive to the target repair bank not meeting the initial judgment condition, perform segmentation processing on the FB feature map according to an association relationship to generate a segmented feature map group, wherein the segmented feature map group comprises segmented feature maps; and
  responsive to a bank feature map state of the target repair bank being a second initial state and a new FB feature map being generated in the segmented feature map group, adjust the second initial state to a first initial state.

20. The device of claim 19, wherein the second repair processing circuit is configured to perform the following operations:
  acquiring a state judgment set, and selecting a target judgment state corresponding to the bank feature map state from the state judgment set;
  determining bit positions of the second FBs in each target repair bank according to the target judgment state; and
  performing the second repair processing on the second FBs according to the bit positions of the second FBs.

* * * * *